(12) United States Patent
Pawlak

(10) Patent No.: US 9,711,644 B2
(45) Date of Patent: Jul. 18, 2017

(54) METHODS OF MAKING SOURCE/DRAIN REGIONS POSITIONED INSIDE U-SHAPED SEMICONDUCTOR MATERIAL USING SOURCE/DRAIN PLACEHOLDER STRUCTURES

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/853,073

(22) Filed: Sep. 14, 2015

(65) Prior Publication Data

US 2017/0077301 A1 Mar. 16, 2017

(51) Int. Cl.
| | |
|---|---|
| H01L 29/66 | (2006.01) |
| H01L 29/772 | (2006.01) |
| H01L 29/78 | (2006.01) |
| H01L 29/08 | (2006.01) |

(52) U.S. Cl.
CPC ...... H01L 29/7848 (2013.01); H01L 29/0847 (2013.01); H01L 29/66795 (2013.01); H01L 29/7851 (2013.01)

(58) Field of Classification Search
USPC .......................................................... 257/192
See application file for complete search history.

(56) References Cited

U.S. PATENT DOCUMENTS

| | | | |
|---|---|---|---|
| 6,429,055 B2 * | 8/2002 | Oh ..................... | H01L 29/66772 257/E21.415 |
| 6,677,646 B2 * | 1/2004 | Ieong ................. | H01L 29/66545 257/300 |
| 7,696,019 B2 | 4/2010 | Han | |
| 8,138,030 B2 | 3/2012 | Chang et al. | |
| 2001/0045578 A1 * | 11/2001 | Hueting ............. | H01L 29/0634 257/216 |
| 2006/0027869 A1 * | 2/2006 | Kim ................... | H01L 29/78696 257/351 |

(Continued)

OTHER PUBLICATIONS

Office Action from related U.S. Appl. No. 14/853,012 dated Oct. 28, 2016.

(Continued)

*Primary Examiner* — Sitaramarao S Yechuri
(74) *Attorney, Agent, or Firm* — Amerson Law Firm, PLLC

(57) ABSTRACT

One illustrative method disclosed herein includes, among other things, forming a liner semiconductor material within a trench, the liner material defining a transistor cavity, and forming spaced-apart source/drain placeholder structures that are at least partially positioned within the transistor cavity, the spaced-apart source/drain placeholder structures defining a gate cavity therebetween where a portion of the liner semiconductor material is exposed within the gate cavity. The method further includes forming a gate structure within the gate cavity and, after forming the gate structure, removing at least a portion of the source/drain placeholder structures to define a plurality of source/drain cavities within the transistor cavity on opposite sides of the gate structure, and forming a source/drain structure in each of the source drain cavities.

36 Claims, 23 Drawing Sheets

(56) References Cited

U.S. PATENT DOCUMENTS

| | | | |
|---|---|---|---|
| 2006/0063320 A1 | 3/2006 | Orlowski et al. | |
| 2013/0099295 A1 | 4/2013 | Baars et al. | |
| 2013/0187236 A1 | 7/2013 | Xie et al. | |
| 2013/0320453 A1* | 12/2013 | Pethe | H01L 29/7854 257/368 |
| 2014/0035000 A1* | 2/2014 | Ontalus | H01L 29/665 257/192 |
| 2014/0151756 A1 | 6/2014 | Chang et al. | |
| 2015/0091088 A1* | 4/2015 | Vielemeyer | H01L 29/7816 257/337 |
| 2015/0187944 A1 | 7/2015 | Ching et al. | |
| 2016/0211251 A1 | 7/2016 | Liaw | |

OTHER PUBLICATIONS

Final Office Action from related U.S. Appl. No. 14/853,012 dated Mar. 28, 2017.

* cited by examiner

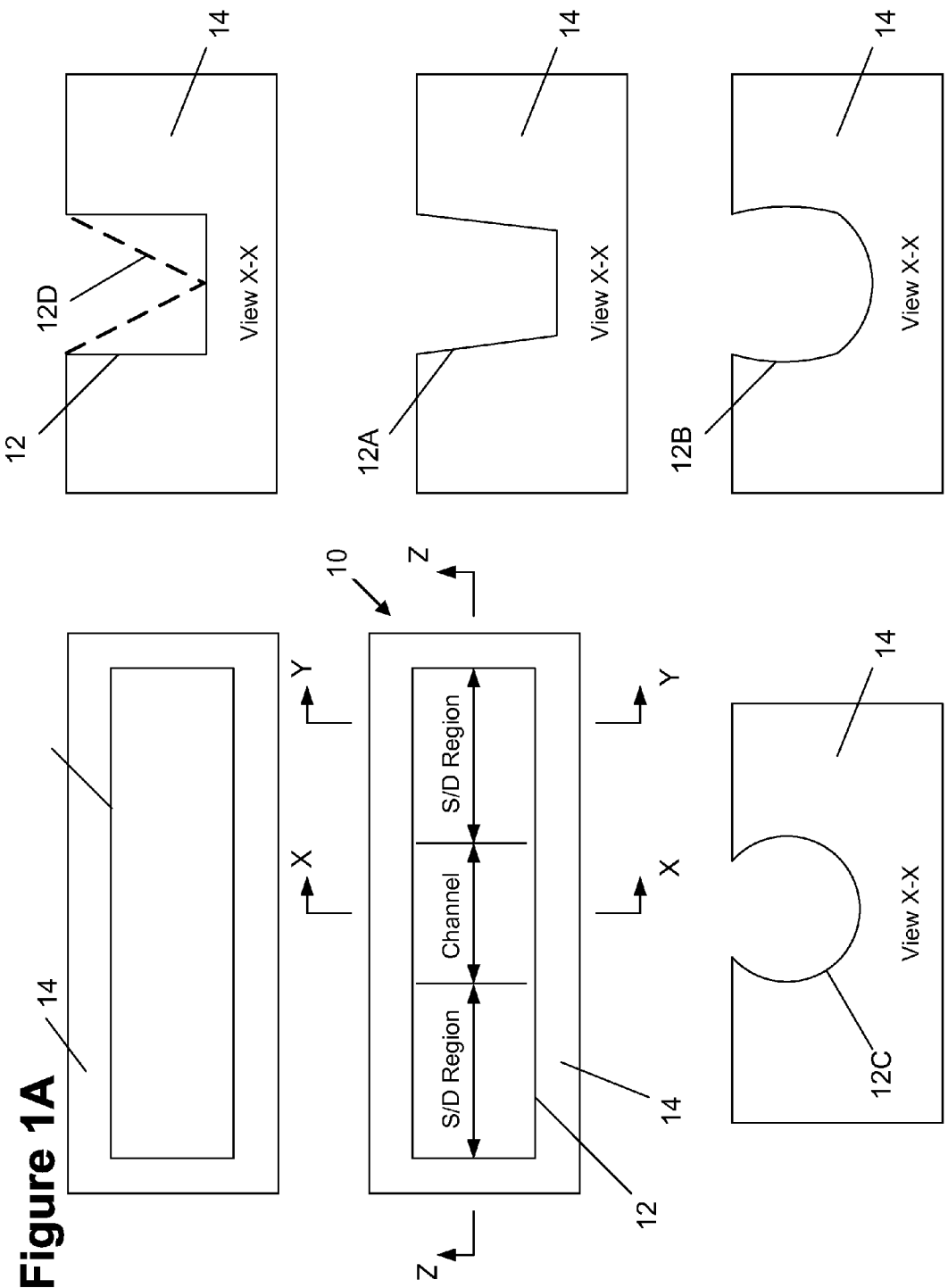

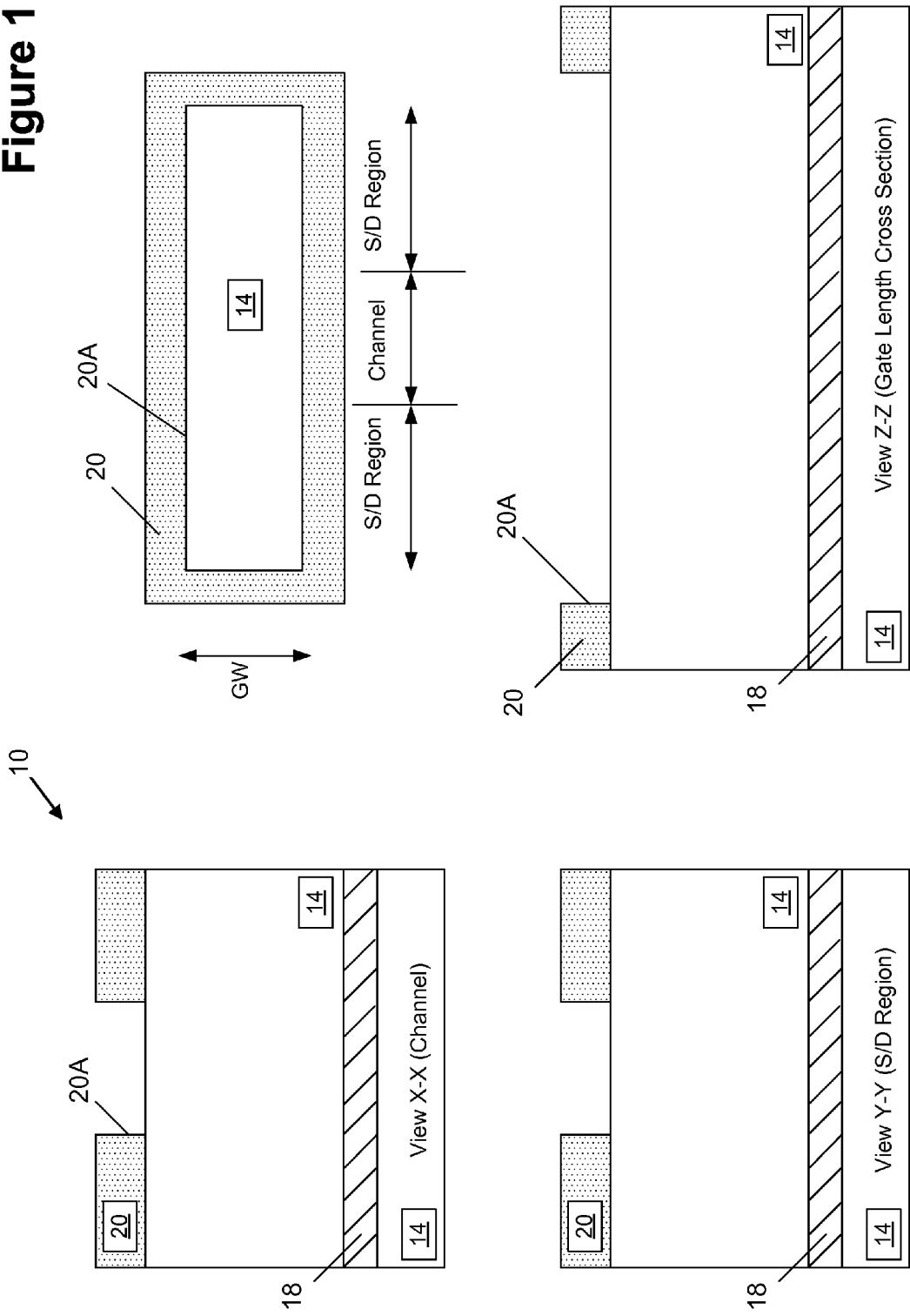

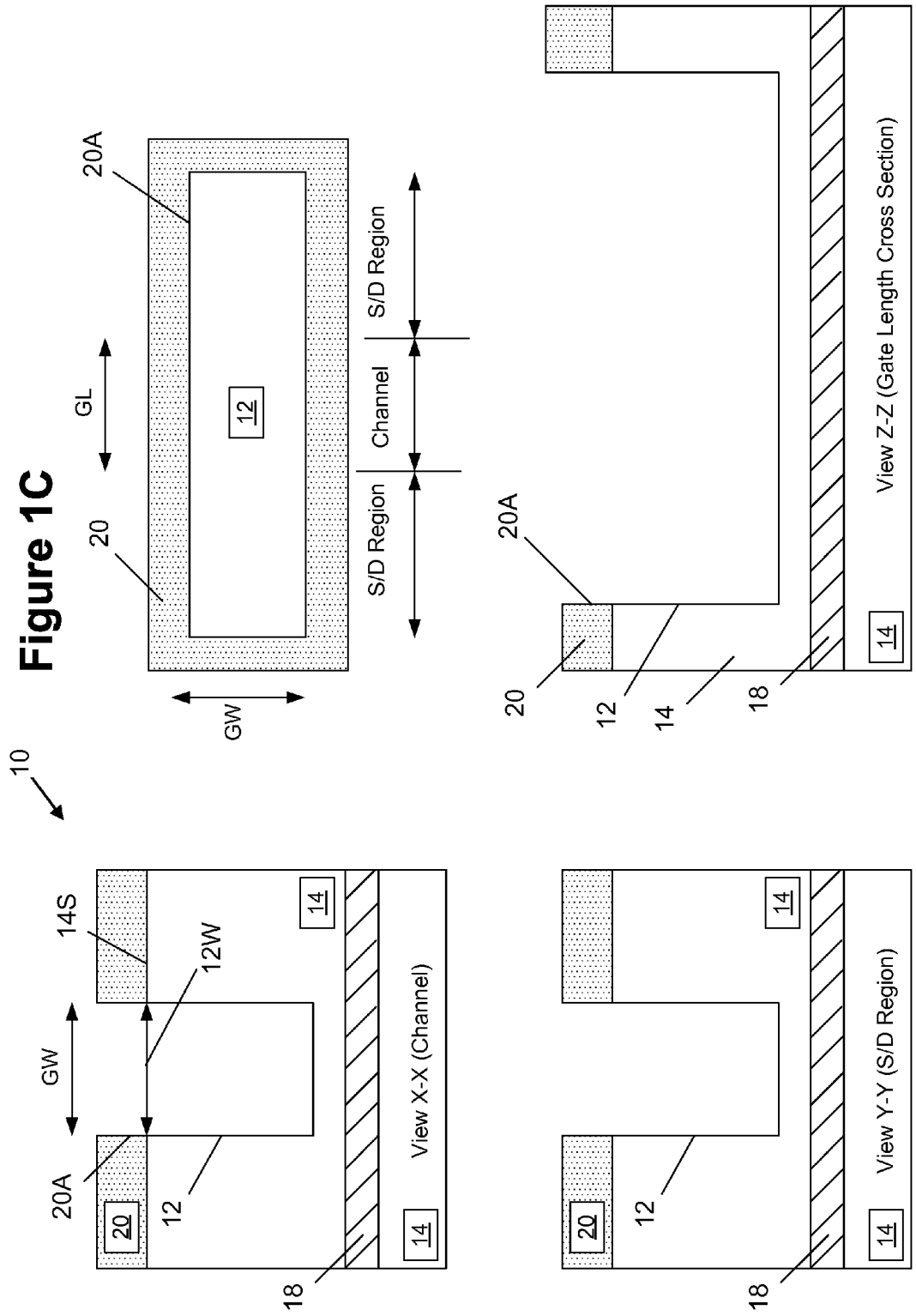

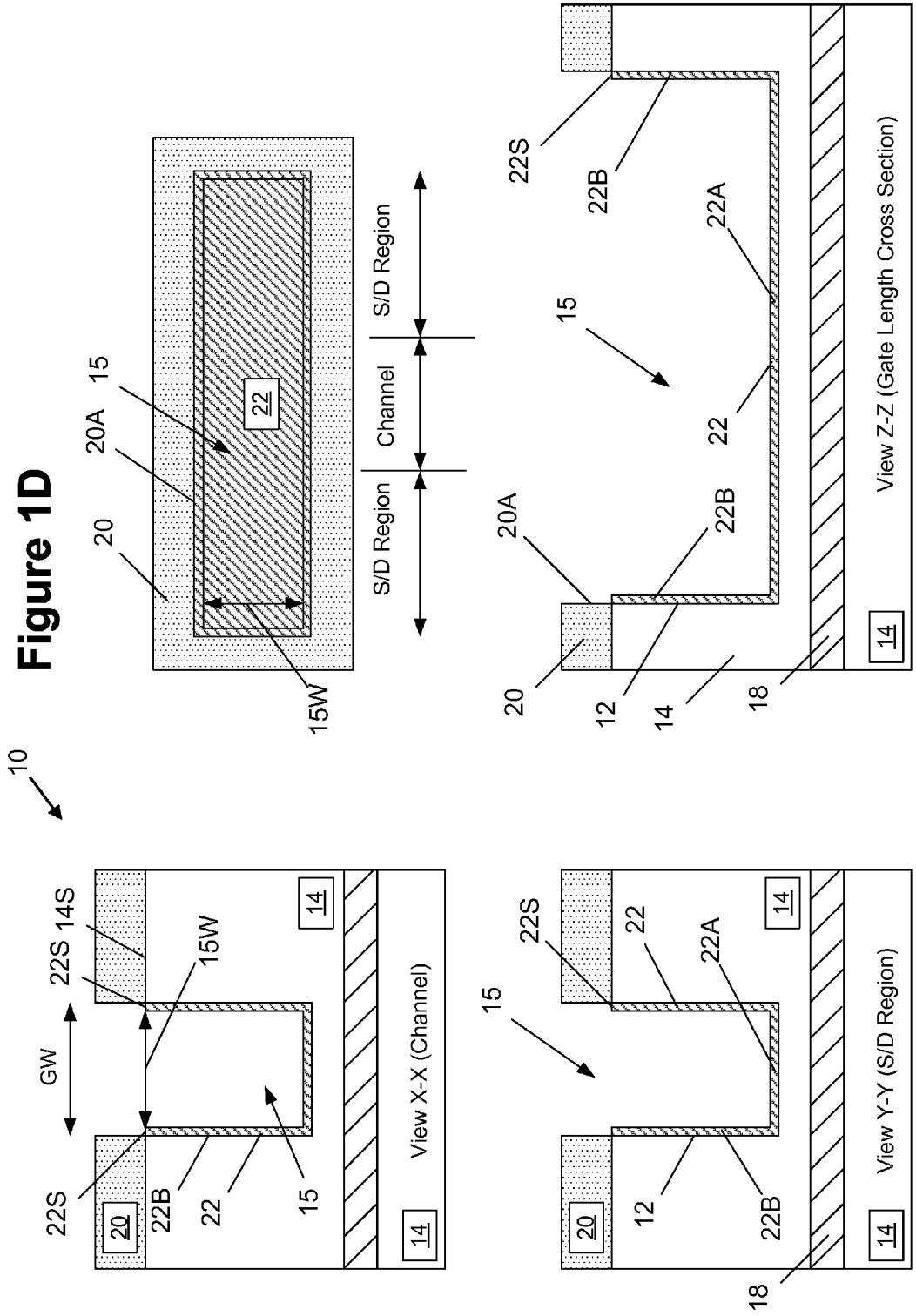

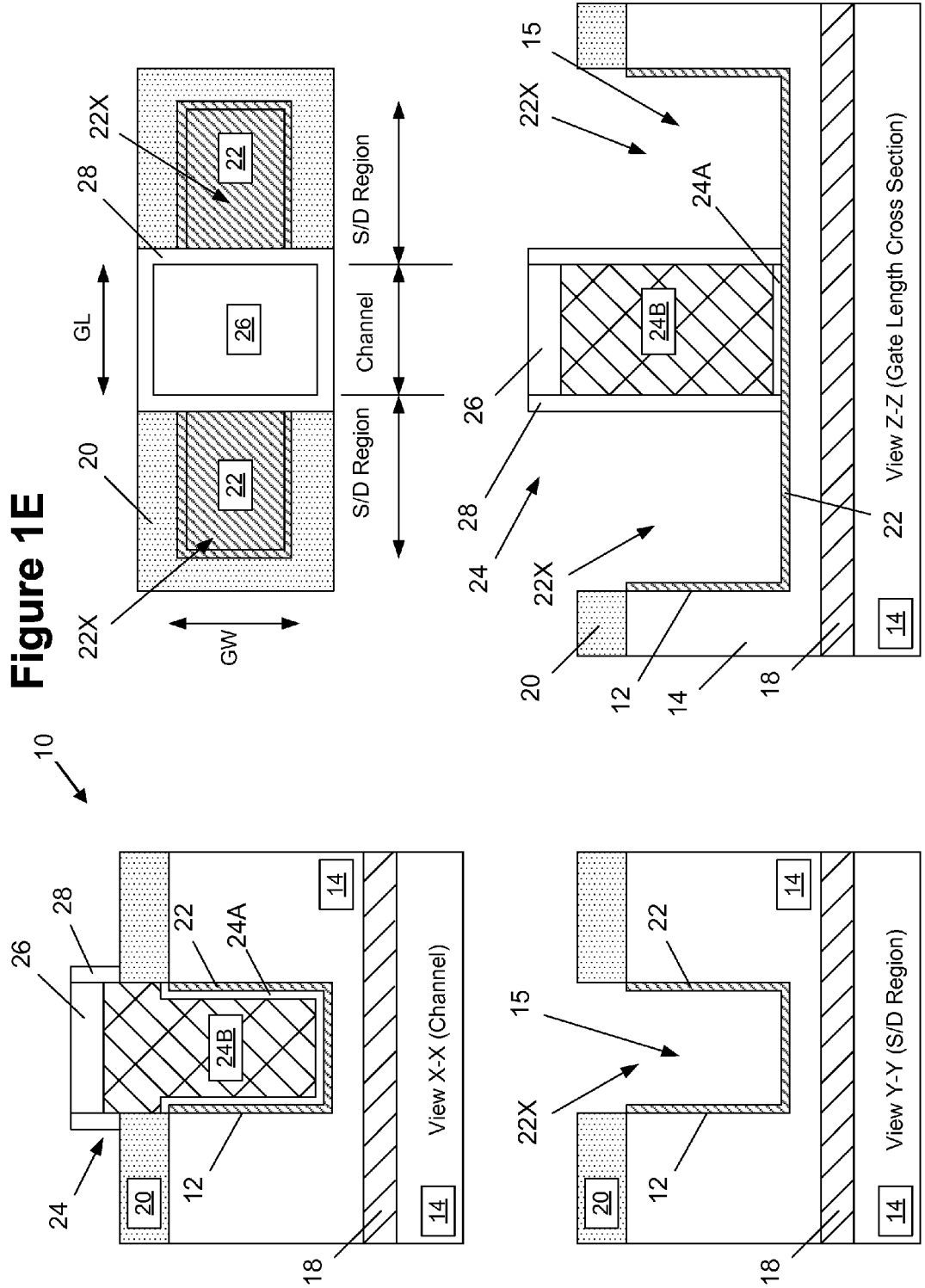

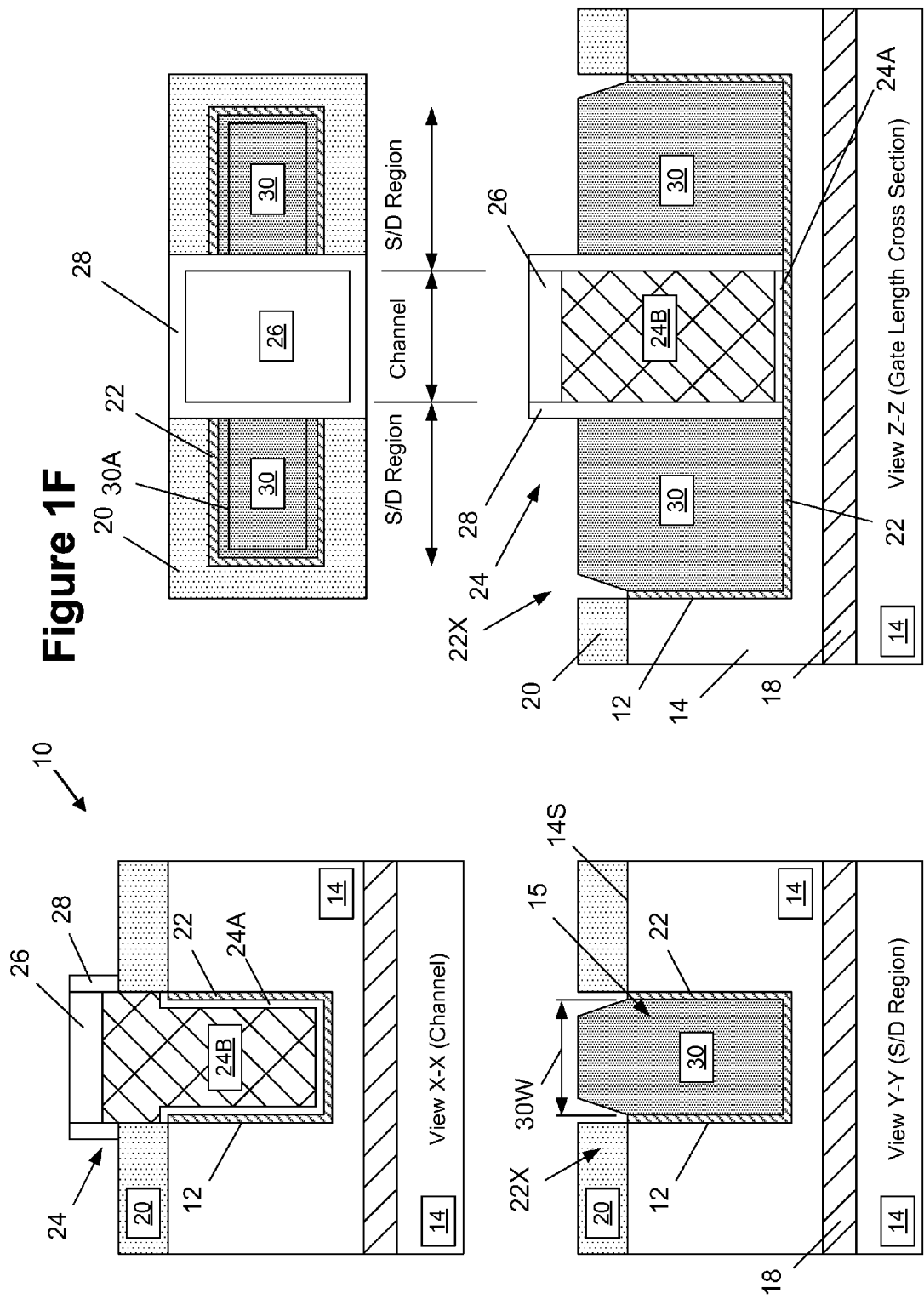

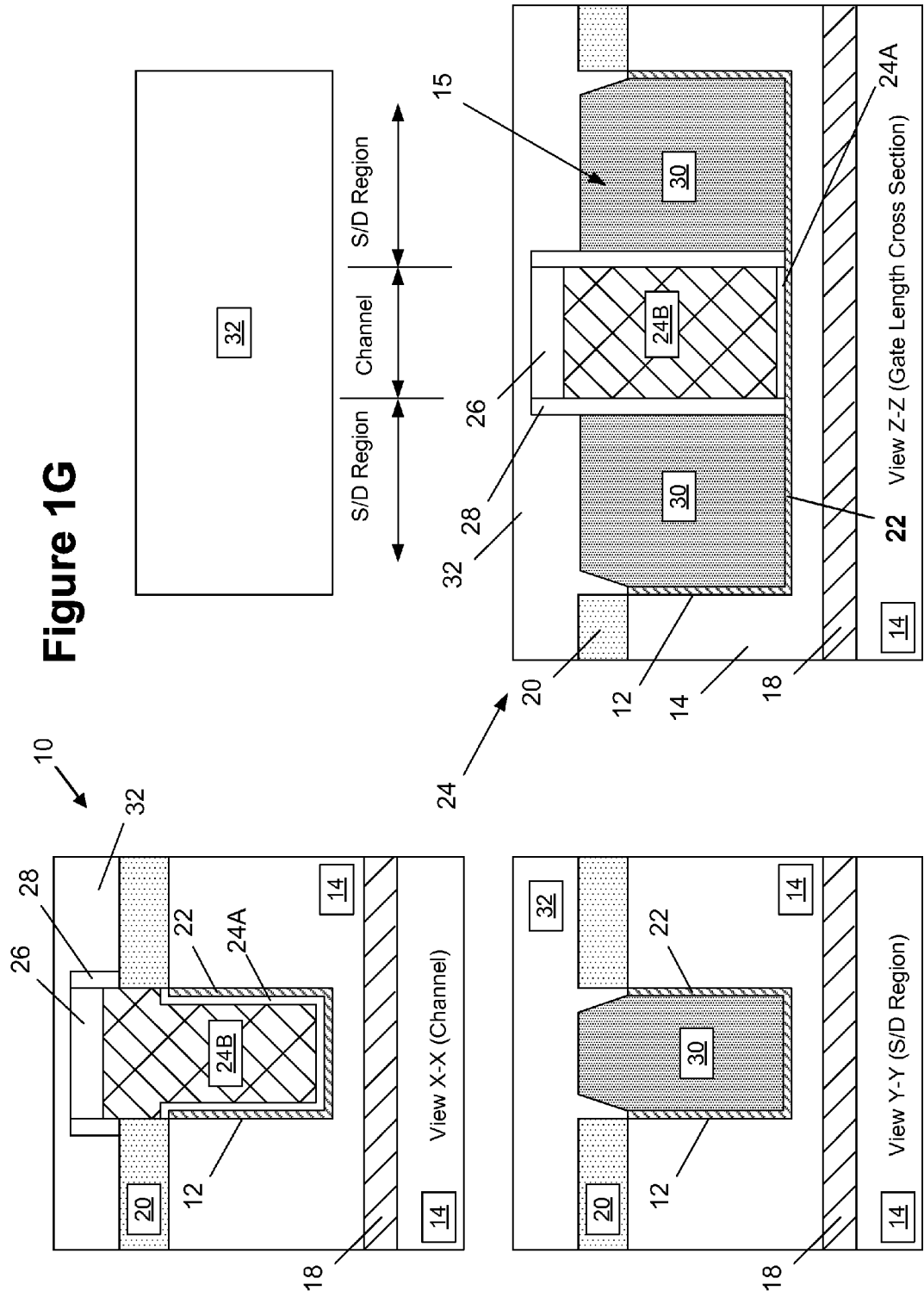

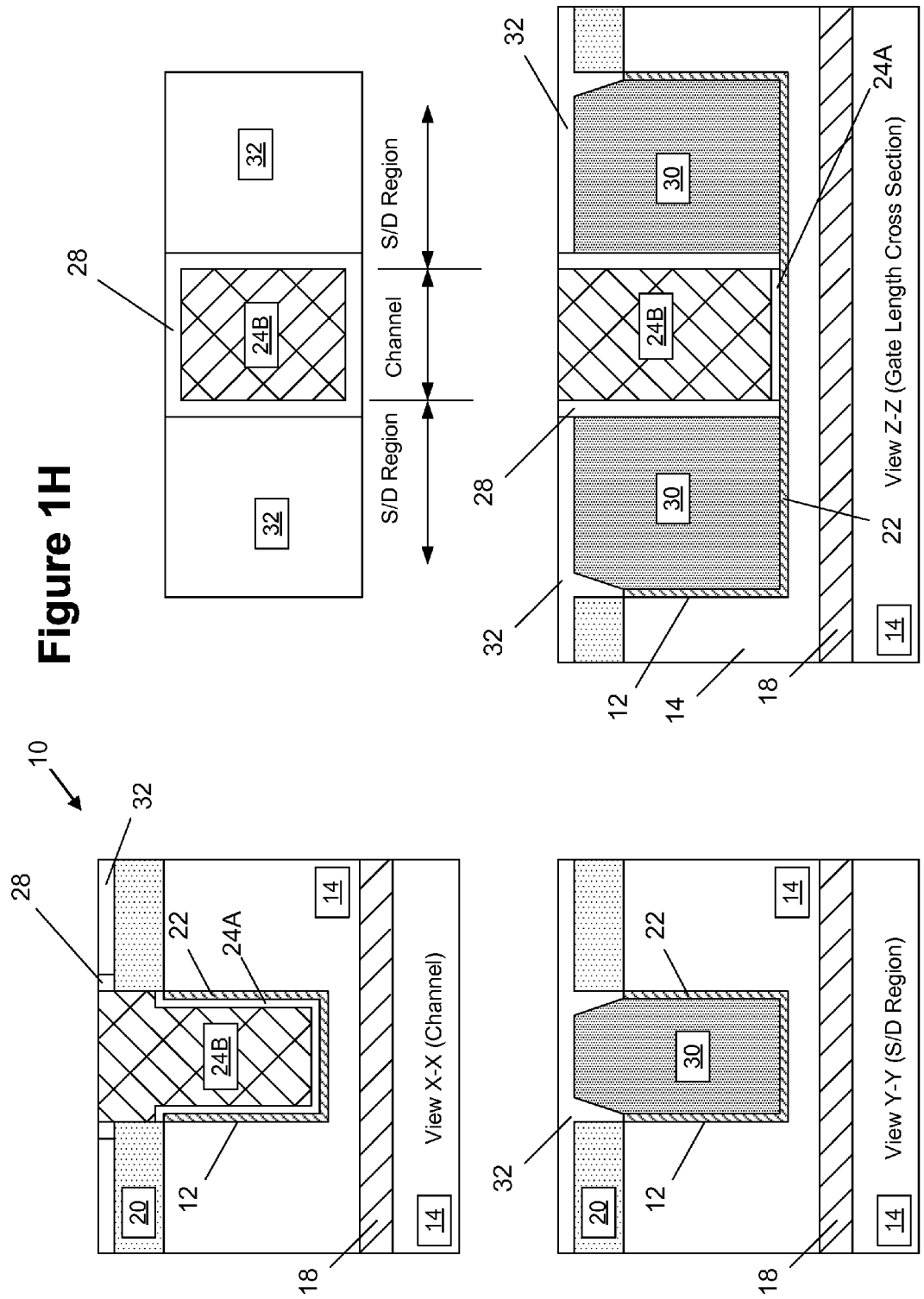

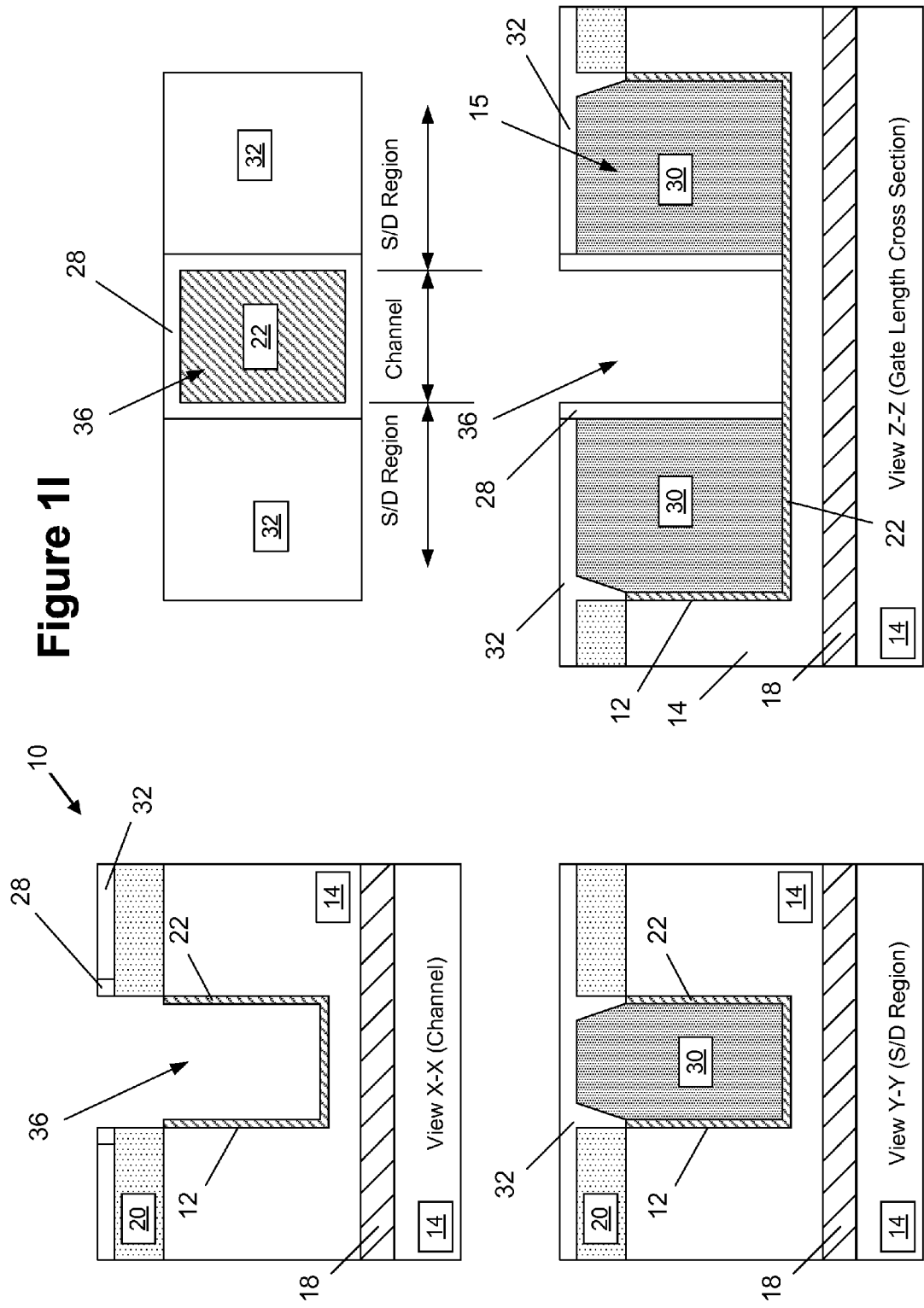

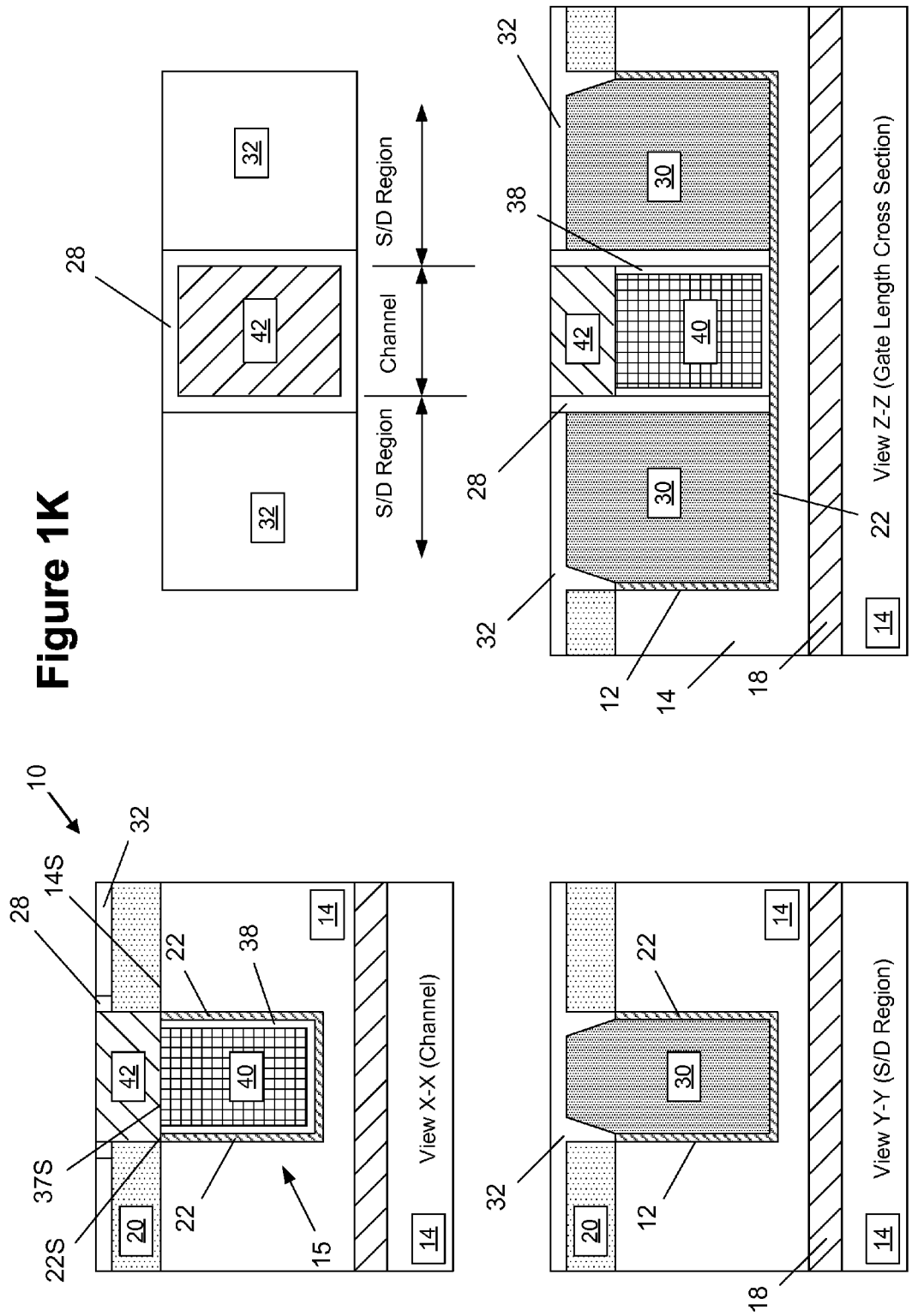

Figure 1L
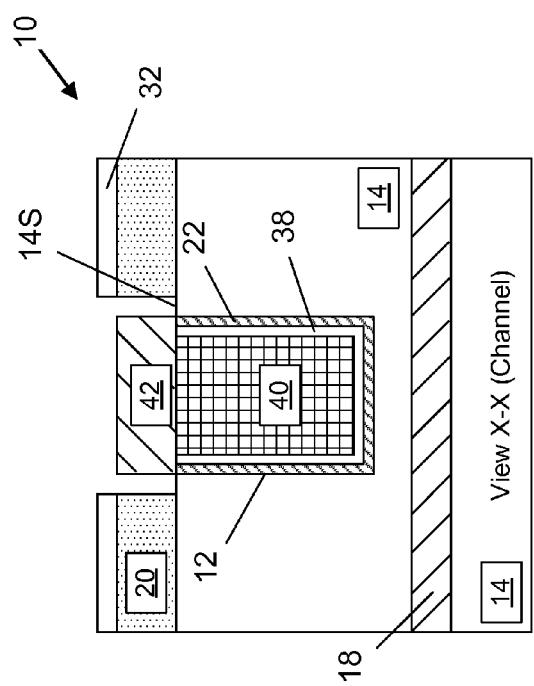
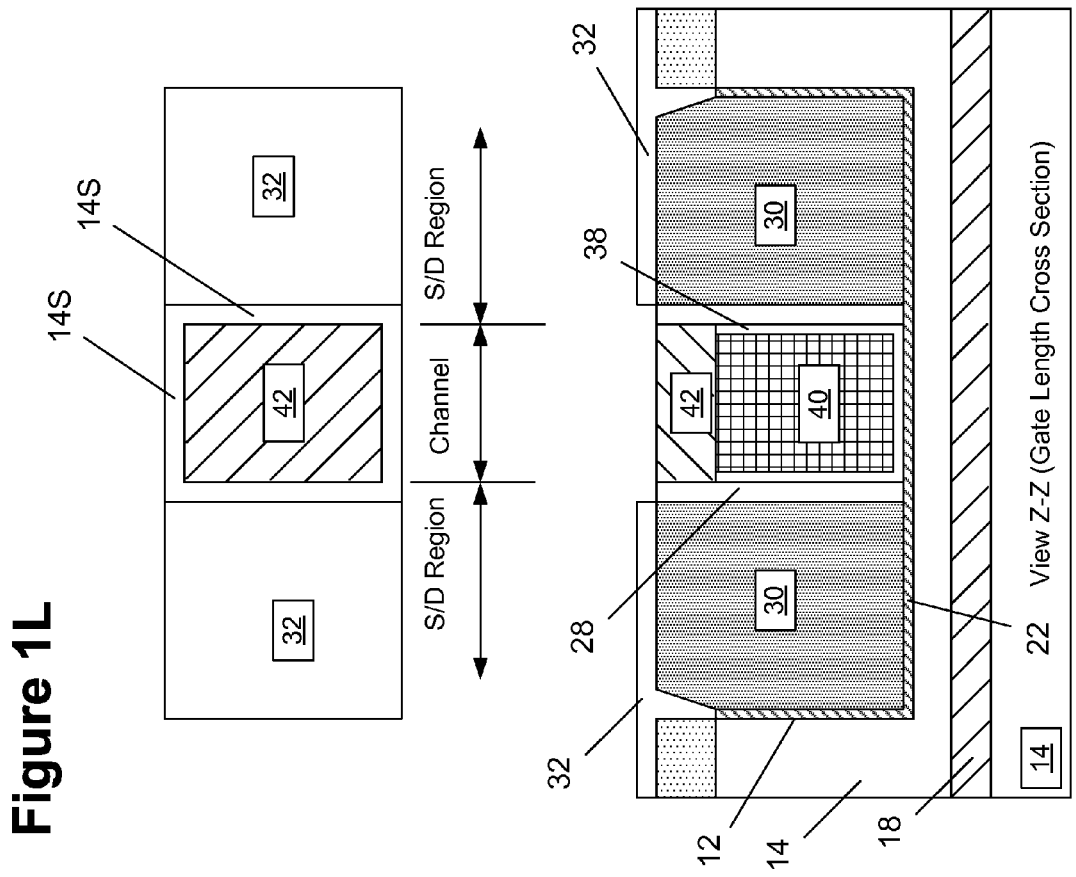
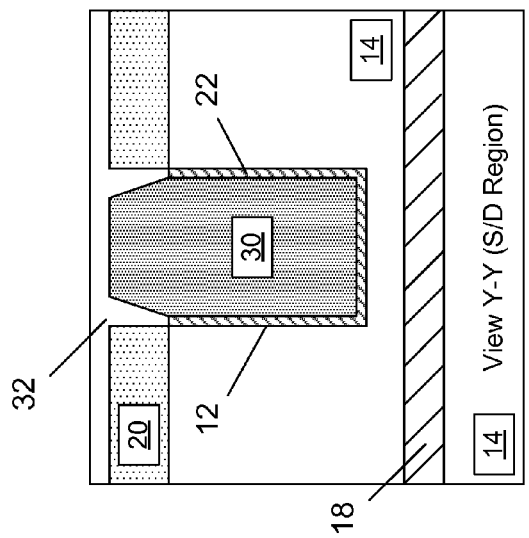

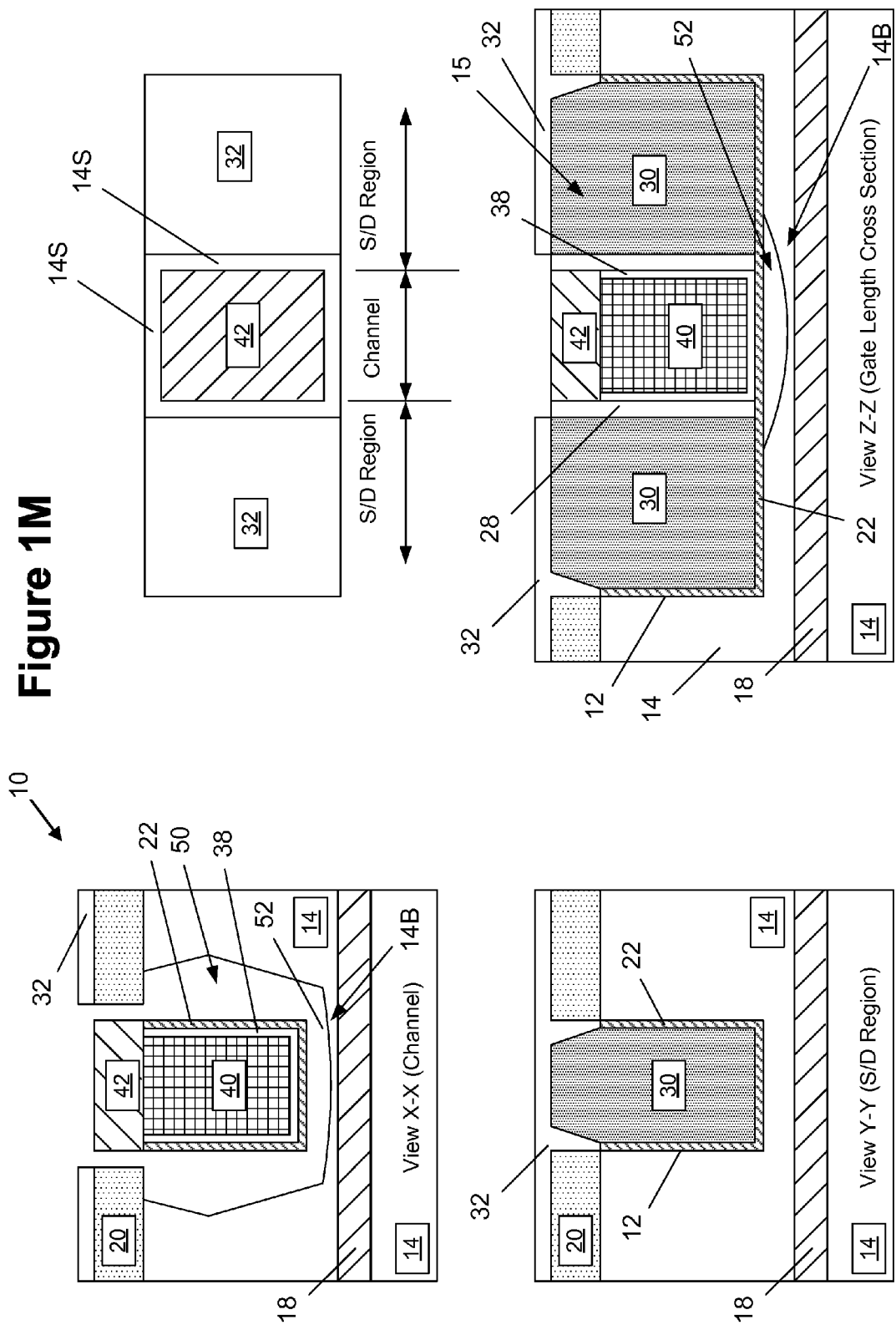

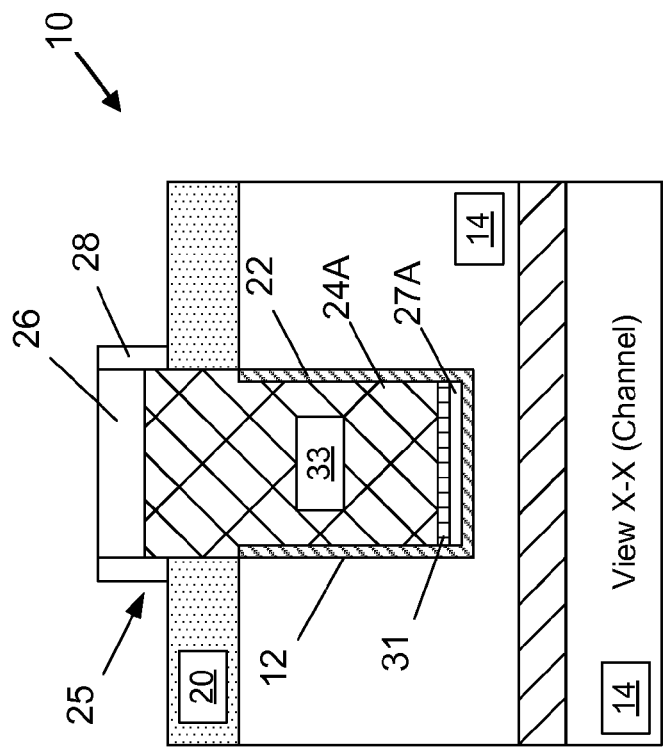
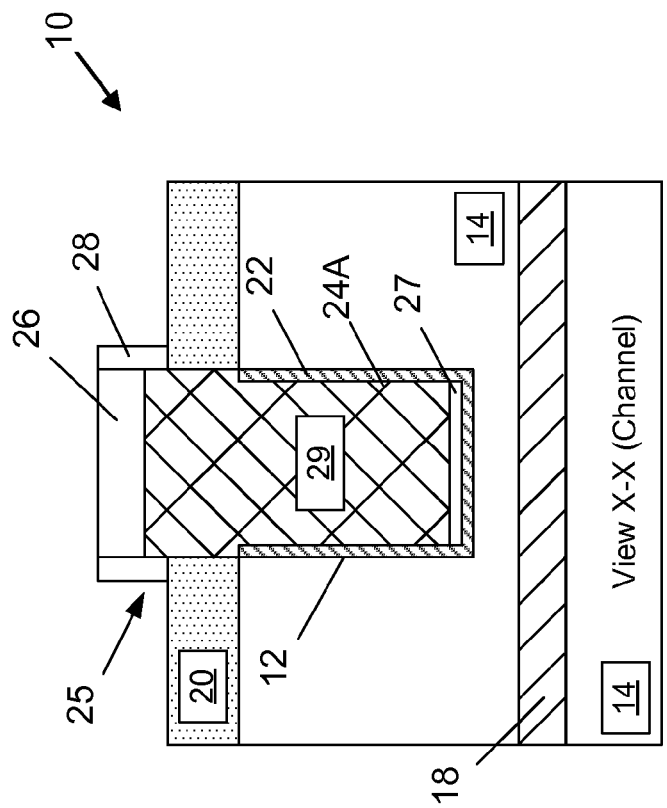

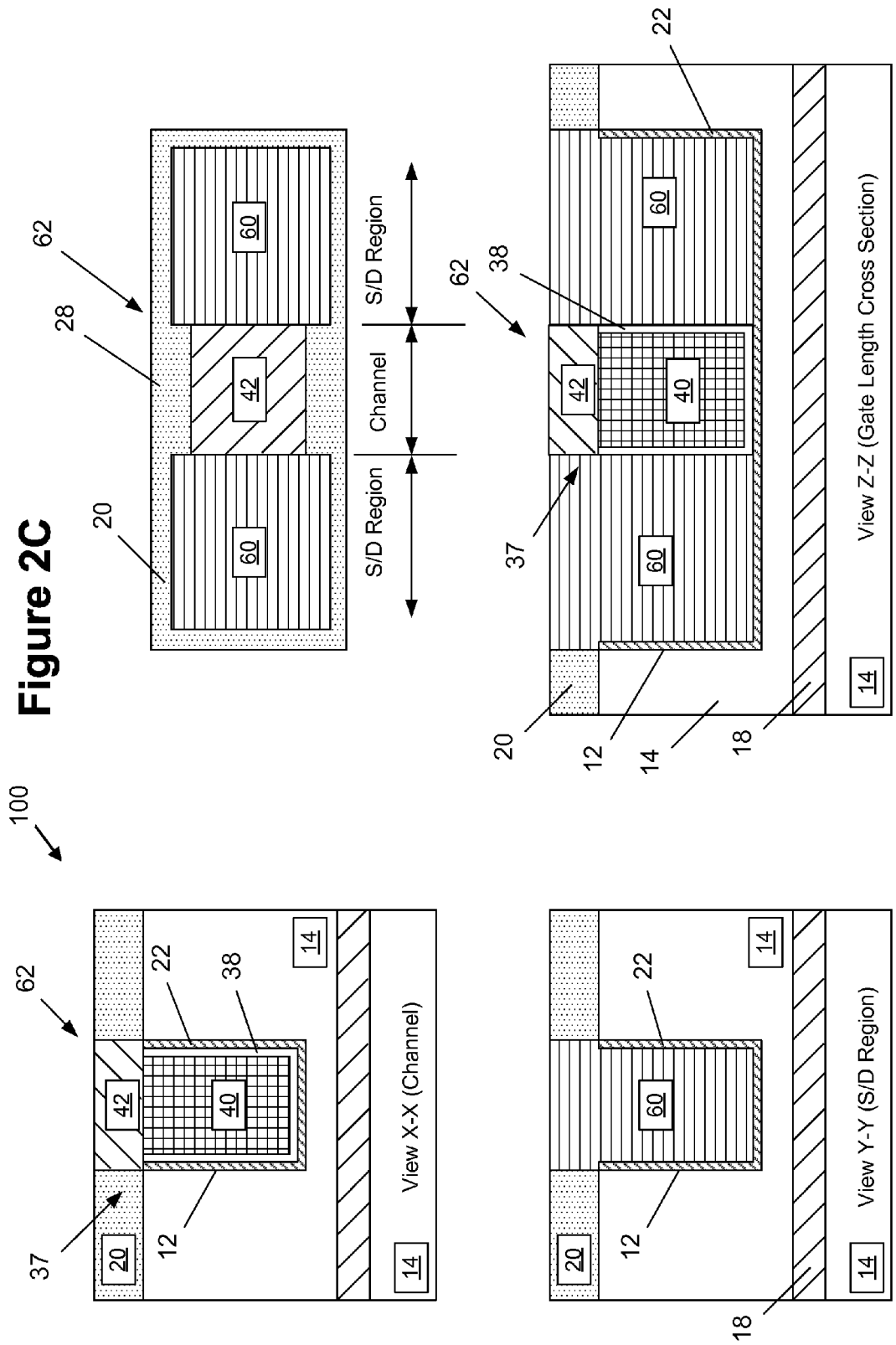

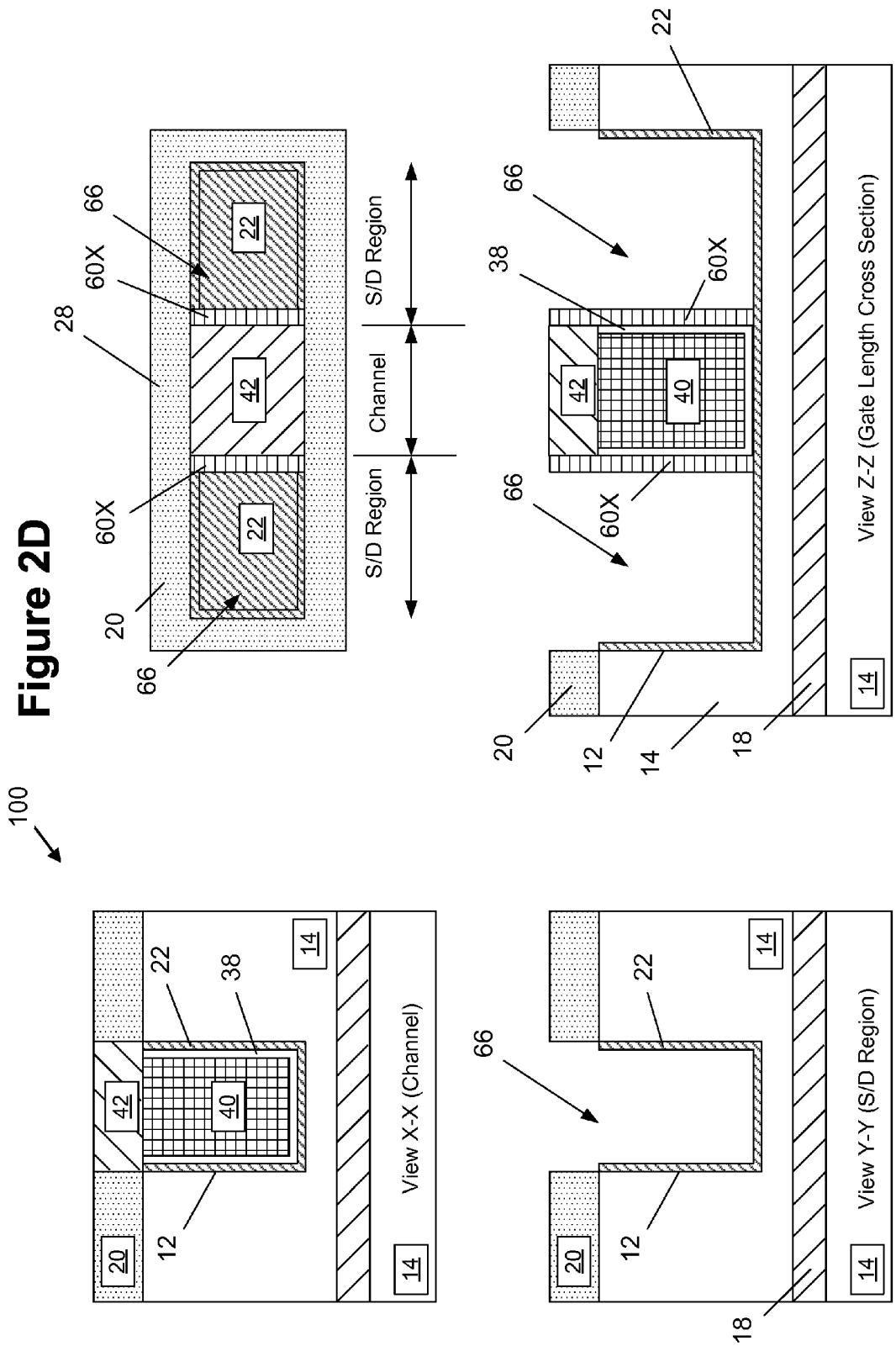

METHODS OF MAKING SOURCE/DRAIN REGIONS POSITIONED INSIDE U-SHAPED SEMICONDUCTOR MATERIAL USING SOURCE/DRAIN PLACEHOLDER STRUCTURES

BACKGROUND OF THE INVENTION

1. Field of the Invention

Generally, the present disclosure relates to the manufacture of FET semiconductor devices, and, more specifically, to various methods of forming source/drain regions that are positioned at least partially inside a generally U-shaped semiconductor material by using a plurality of placeholder source/drain structures and the resulting devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, horizontal and vertical nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region. The gate structures for such transistor devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded. In contrast to a planar transistor device, which as the name implies has a generally planar structure, a so-called FinFET device has a three-dimensional (3D) structure. That is, the gate structure of a FinFET device may be positioned around both the sides and the upper surface of a portion of a fin that was previously defined in the substrate to thereby form a tri-gate structure so as to use a channel having a three-dimensional structure instead of a planar structure. That is, unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. For a given foot-print, FinFETs tend to be able to generate significantly higher drive current density than planar transistor devices.

Another known transistor device is typically referred to as a nanowire device or sometimes a "gate all around" device. In a nanowire device, at least the channel region of the device is comprised of one or more very small diameter, wire-like semiconductor structures. As with the other types of transistor devices discussed above, current flow through a nanowire device is controlled by setting the voltage applied to the gate electrode. When an appropriate voltage is applied to the gate electrode, the channel region of the nanowire device becomes conductive, and electrical current is permitted to flow between the source region and the drain region through the conductive channel region, i.e., current flows through the nanowire structure.

As device dimensions have decreased, it is becoming ever more challenging to maintain adequate control of the channel region of transistor devices during operation. Device designers have used various techniques to insure that there is adequate capacitive coupling between the gate electrode of the device and the channel region of the device during operation. Absent proper capacitive coupling, control of the channel region is difficult and may result in devices having less desirable electrical performance capabilities.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further gate length reduction below 15 nm is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Device designers are also under constant pressure to reduce the physical size of integrated circuit products, especially products intended for mobile applications such as laptop computers, cell phones, etc. Thus, increasing the packing density of transistor devices in such integrated circuit products is always a desirable goal.

The present disclosure is directed to various semiconductor devices with a gate positioned at least partially inside a generally U-shaped channel semiconductor material by using a plurality of placeholder source/drain structures and various methods of making such devices that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming source/drain regions that are positioned at least partially inside a generally U-shaped semiconductor material by using a plurality of placeholder source/drain structures and the resulting devices.

One illustrative method disclosed herein includes, among other things, forming a trench in a semiconductor substrate, forming a liner semiconductor material within the trench, the liner semiconductor material defining a transistor cavity, forming a plurality of spaced-apart source/drain placeholder structures that are at least partially positioned within the transistor cavity, the spaced-apart source/drain placeholder structures defining a gate cavity therebetween where a portion of the liner semiconductor material is exposed within the gate cavity. In this embodiment, the method further includes forming a gate structure that is at least partially positioned within the gate cavity, and, after forming the gate structure, removing at least a portion of the source/drain placeholder structures to define a plurality of source/drain cavities within the transistor cavity on opposite sides of the gate structure, and forming a source/drain structure in each of the source drain cavities, wherein at least a portion of each of the source/drain structures is positioned within the transistor cavity.

Another illustrative method disclosed herein involves, among other things, forming a trench in a semiconductor substrate, forming a generally U-shaped liner semiconductor material within the trench, wherein the liner semiconductor material defines a transistor cavity, and forming a plurality of spaced-apart source/drain placeholder structures that are at least partially positioned within the transistor cavity, the spaced-apart source/drain placeholder structures defining a gate cavity therebetween where a portion of the liner semiconductor material is exposed within the gate cavity. In this example, the method further includes forming a gate structure that is at least partially positioned within the gate cavity, and, after forming the gate structure, removing at least a portion of the source/drain placeholder structures to define a plurality of source/drain cavities within the transistor cavity on opposite sides of the gate structure and forming a source/drain structure comprised of a metal or metal alloy in each of the source drain cavities, wherein at least a portion of each of the source/drain structures is positioned within the transistor cavity.

One illustrative device disclosed herein includes, among other things, a trench defined in a semiconductor substrate, a liner semiconductor material positioned within the trench, the liner semiconductor material defining a transistor cavity, a gate structure that is at least partially positioned within the transistor cavity, a source region structure and a drain region structure positioned on opposite sides of the gate structure, wherein the source region structure and the drain region structure are comprised of a metal or a metal alloy and wherein at least a portion of each of the source region structure and the drain region structure is positioned within the transistor cavity.

BRIEF DESCRIPTION OF THE DRAWINGS

The disclosure may be understood by reference to the following description taken in conjunction with the accompanying drawings, in which like reference numerals identify like elements, and in which:

FIGS. 2A-2E depict yet other illustrative methods disclosed herein of forming source/drain regions that are positioned at least partially inside a generally U-shaped semiconductor material by using a plurality of placeholder source/drain structures.

Figure 1J:
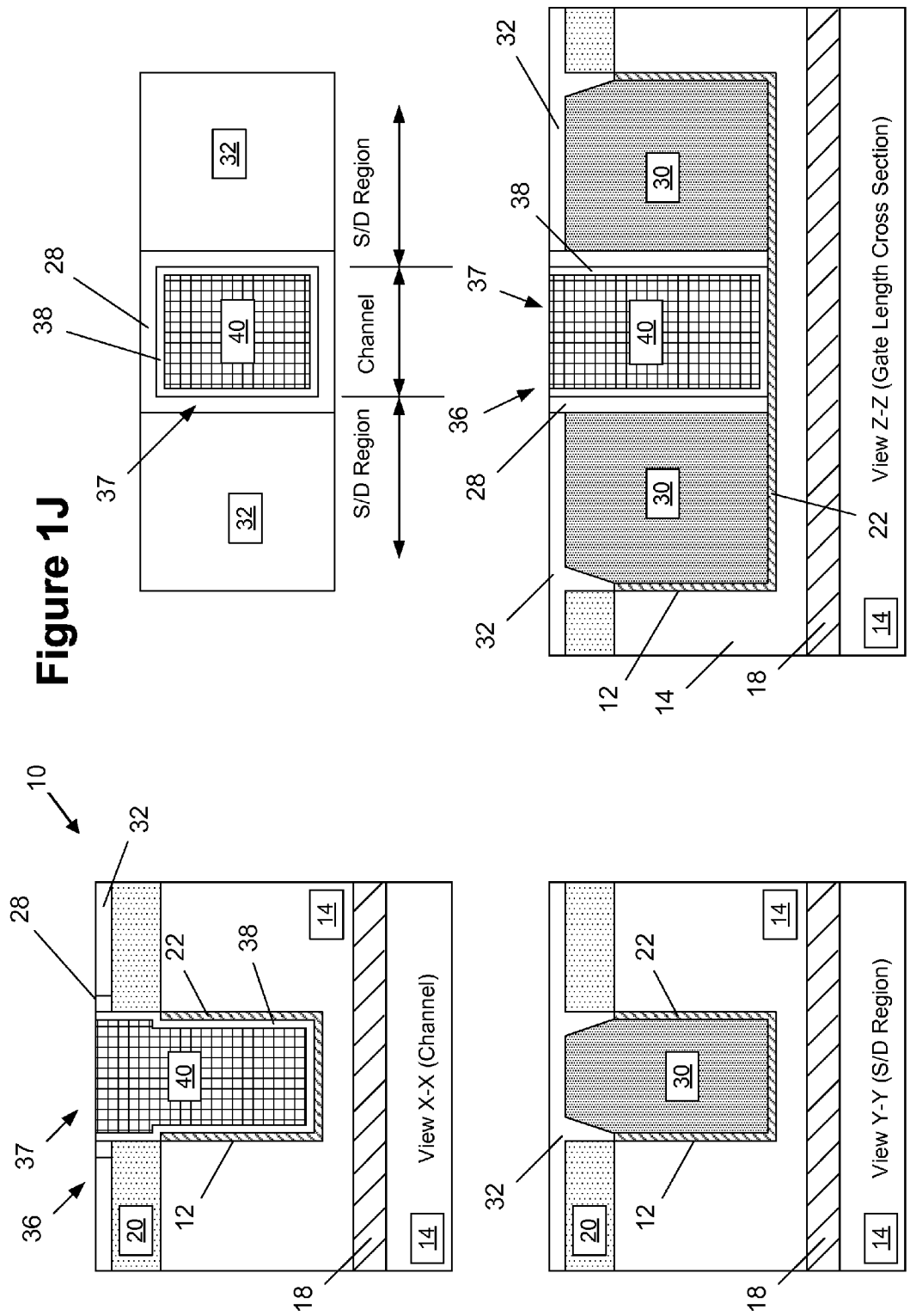
FIGS. 1A-1T depict various illustrative methods disclosed herein of forming various semiconductor devices with a gate positioned at least partially inside a generally U-shaped channel semiconductor material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various semiconductor devices with a gate positioned at least partially inside a cavity defined by a generally U-shaped liner channel semiconductor material and various methods of making such devices. The present disclosure is also directed to other illustrative methods disclosed herein of forming source/drain regions that are positioned at least partially inside a generally U-shaped semiconductor material by using a plurality of placeholder source/drain structures. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 1N:
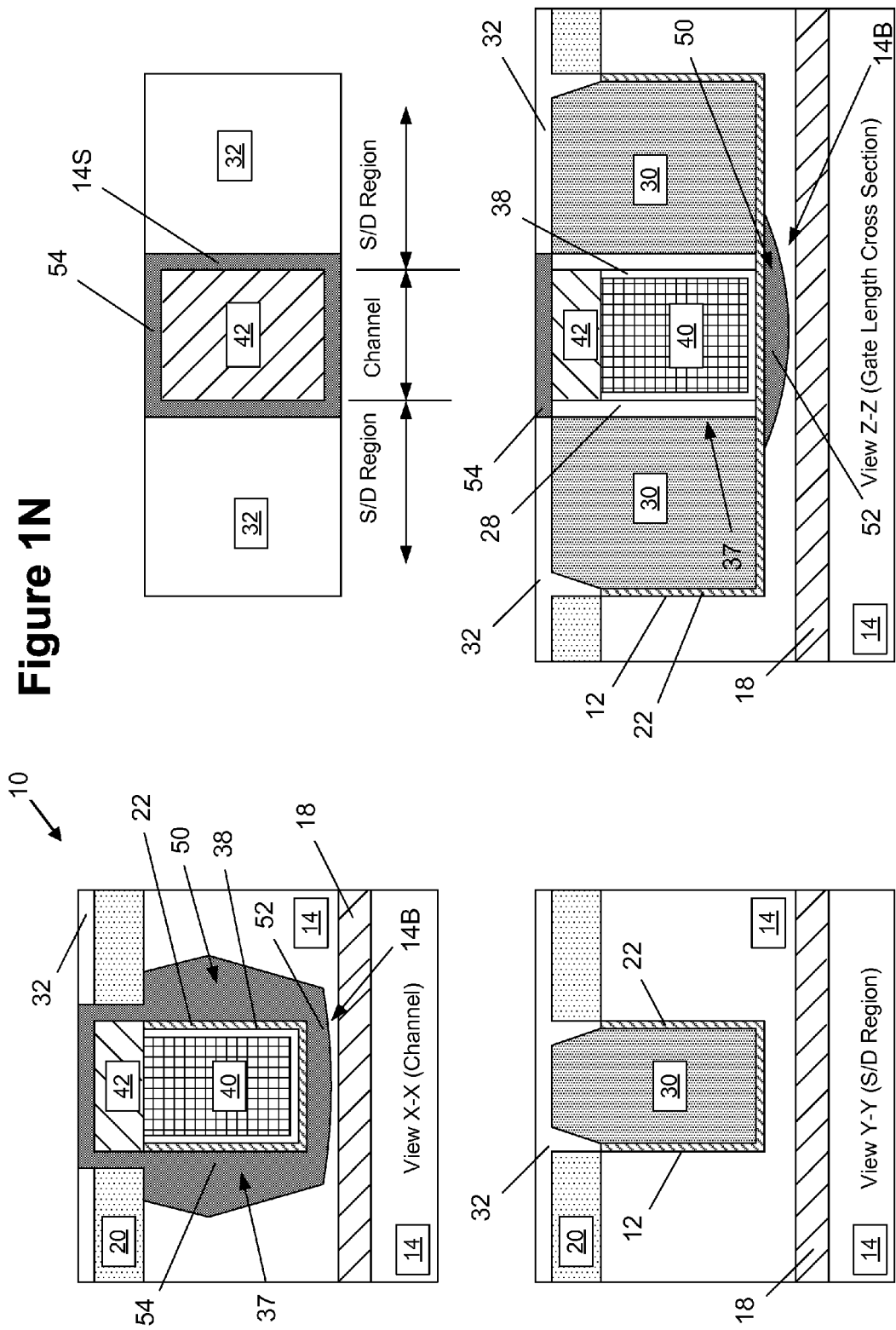
Figure 10:
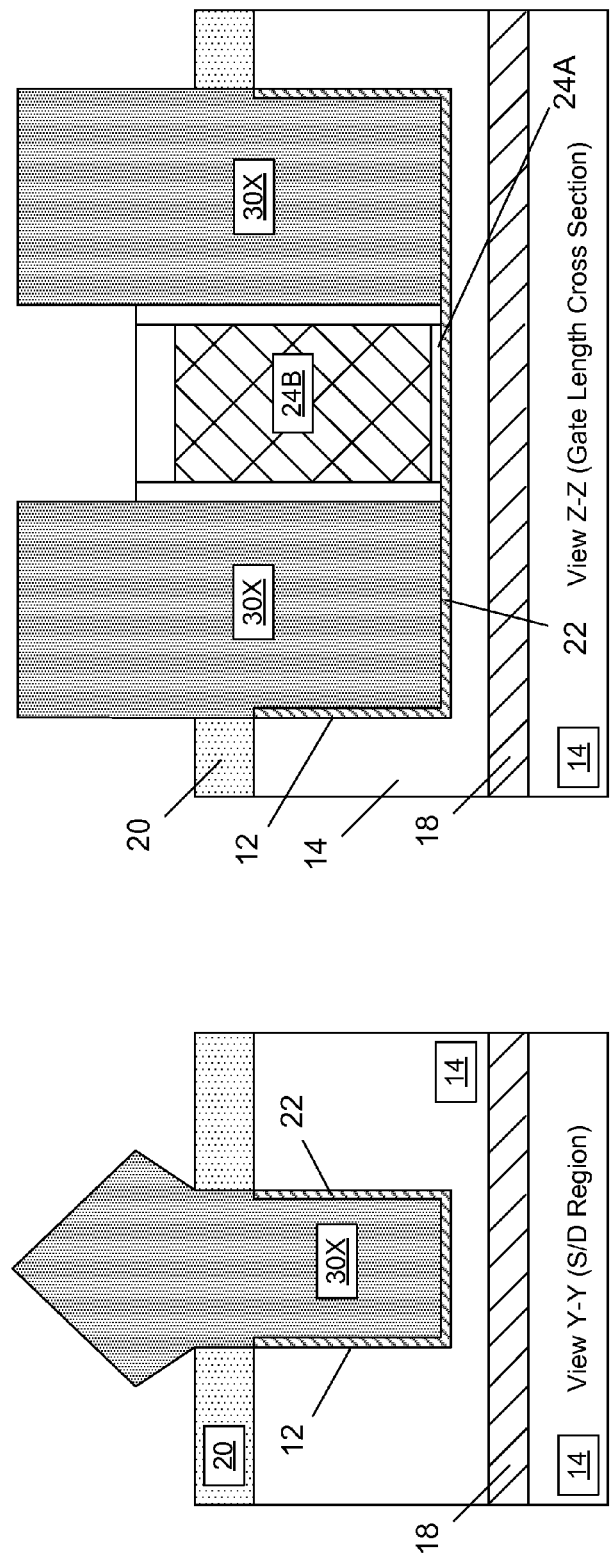
Figure 1Q:
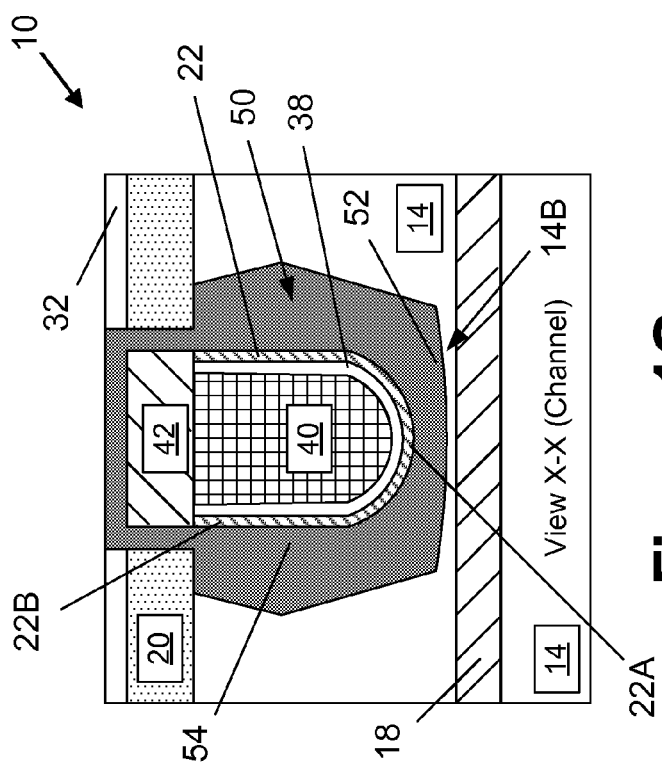
Figure 1P:
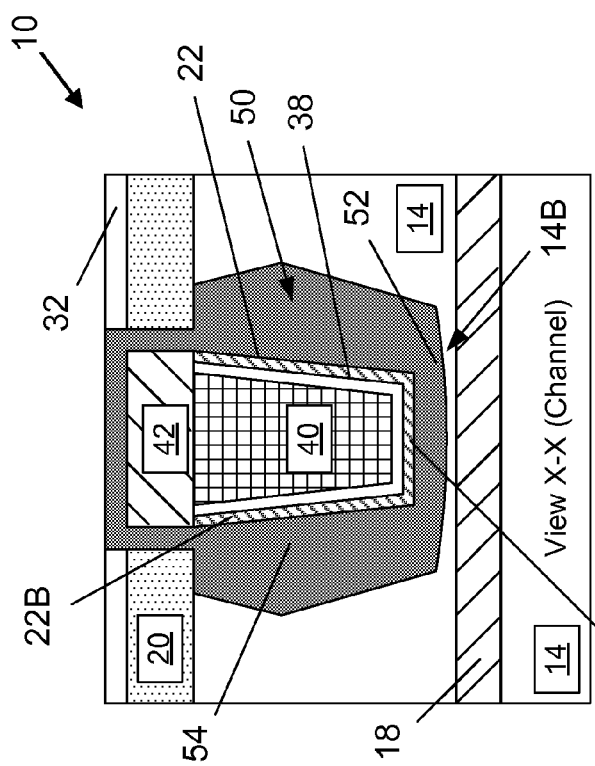
Figure 1T:
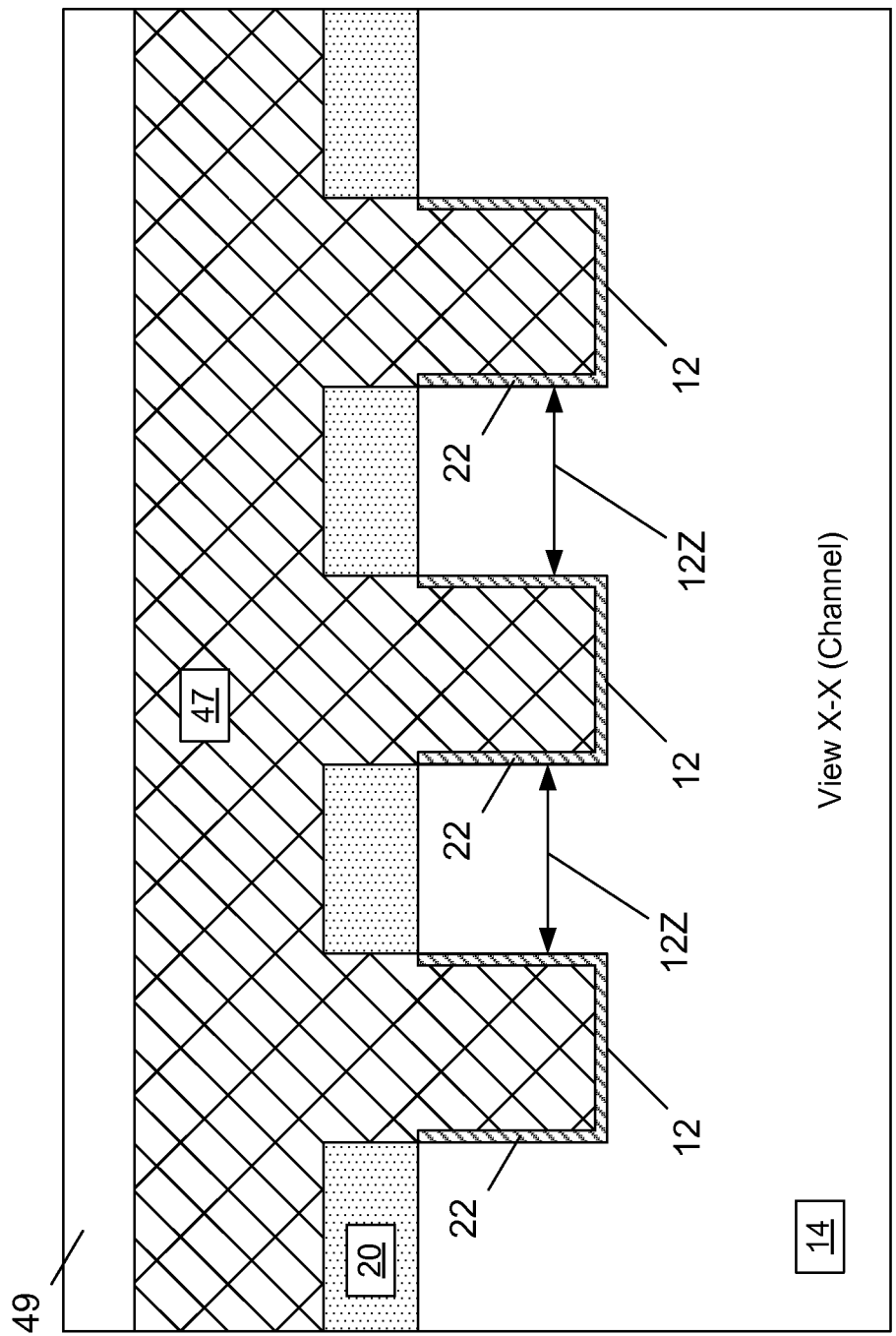

FIGS. 1A-1T depict various illustrative methods disclosed herein of forming various semiconductor devices with a gate positioned at least partially inside a generally U-shaped channel semiconductor material. FIG. 1A is provided to depict where various cross-sectional views are depicted in the attached drawings. In general, a trench 12 will be formed in a semiconductor substrate 14 and a thin generally U-shaped liner semiconductor material (when viewed in a cross-section taken through the channel region of the device in a direction parallel to the gate width (GW) direction of the device) will be formed in the trench 12, e.g., grown on the sidewalls and bottom of the trench 12. Additionally, as will be appreciated by those skilled in the art after a complete reading of the present application, the trench 12 can be very long and cut into shorter trenches after the thin generally U-shaped liner semiconductor material (i.e., the epi liner) is formed in the trench 12. The gate structure and the source/drain regions for the device will be formed at least partially (and in some cases entirely) within the generally U-shaped liner semiconductor material. As depicted in FIG. 1A, the shape of the initial trench and the corresponding generally U-shaped liner semiconductor material can vary depending upon the particular application. For example, FIG. 1A depicts a generally rectangular shaped trench 12, a tapered trench 12A, a more U-shaped trench 12B, an "inverted Omega" shaped trench 12C, a "V" shaped trench depicted by the dashed line 12D, etc. As used herein and in the attached claims, when reference is made to the trench, the liner semiconductor material and/or the gate materials as having a "generally U-shaped cross-sectional configuration" and/or being "generally U-shaped," such language should be understood and interpreted to cover any desired shape of the initial trench e.g., the trenches 12, 12A, 12B, 12C and 12D where the trench has sidewalls and a bottom surface. In the following drawings, the view "X-X" is a cross-sectional view taken through the channel region of the device in a direction parallel to the gate width (GW) direction of the device; the view "Y-Y" is a cross-sectional view taken through one of the source/drain regions of the device in a direction parallel to the gate width direction of the device; and the view "Z-Z" is a cross-sectional view taken through the channel region and both of the source/drain regions of the device in a direction corresponding the gate length (GL—current transport) direction of the device.

As depicted in FIG. 1B, one illustrative embodiment of the device 10 will be formed in and above a semiconductor substrate 14, such as a silicon substrate. However, the terms "substrate" or "semiconductor substrate" should be understood to cover all semiconducting materials and all forms of such materials. The device 10 may be either an NMOS or a PMOS transistor. The gate structure of the device 10 may be formed using either so-called "gate-first" or "replacement gate" ("gate-last") techniques. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 10 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

FIG. 1B depicts the device 10 after several process operations were performed. First, an isolation implant region 18 was formed in the substrate 14 by performing an ion implantation process through an implant mask (not shown), such as a patterned layer of photoresist material. In the case of an NMOS device 10, P-type dopants will be implanted to form the isolation implant region 18. Conversely, in the case of a PMOS device 10, N-type dopants will be implanted to form the isolation implant region 18. The dopant concentration of the isolation implant region 18 should be such that it functions to electrically isolate the portion of the substrate 14 positioned above the isolation implant region 18 from the portion of the substrate 14 positioned below the isolation implant region 18. The actual concentration of dopants in the isolation implant region 18 may vary depending upon the particular application, e.g., $10^{15}$-$10^{16}$ ions/cm$^3$. In one embodiment, the isolation implant region 18 may have a vertical thickness that is at least about 20 nm or more. An anneal process may or may not be performed after the ions are implanted into the substrate 14 before performing any other process operations. Also depicted in FIG. 1B is a patterned hard mask layer 20, e.g., silicon dioxide, with an opening 20A formed therein that corresponds to the trench to be formed in the substrate 14. The patterned hard mask 20 may be formed by depositing the hard mask material and patterning the hard mask material by performing known masking and etching processes.

FIG. 1C depicts the device 10 after an etching process, e.g., an anisotropic etching process, was performed through the patterned hard mask layer 20 to define one example of the illustrative trench 12 in the substrate 14 wherein the trench 12 has a generally U-shaped cross-sectional configuration (a rectangular cross-sectional configuration in the example depicted in the drawings). As mentioned earlier, the trench may have other configurations, such as the trenches 12A, 12B, 12C and 12D shown in FIG. 1A. Unless otherwise noted, in the illustrative examples depicted in the attached drawings, the trench 12 shown in FIG. 1C will be shown. However, in an actual real-world device, the sidewalls of the trench 12 may be somewhat inwardly tapered, like the trench 12A shown in FIG. 1A. In some cases, the trench may tend to have a more rounded configuration or non-linear configuration (like the trenches 12B, 12C shown in FIG. 1A) as compared to the generally rectangular configuration of the trench 12 shown in FIG. 1C. Thus, the size and configuration of the trenches with the generally U-shaped cross-sectional configuration, and the manner in which they are made, should not be considered a limitation of the present invention. The width and height of the trench 12 may vary depending upon the particular application. In one illustrative embodiment, the trench 12 may have a lateral width 12W (in the gate width direction—see view X-X) at the upper surface 14S of the substrate of about 20 nm and a vertical depth of about 30 nm.

FIG. 1D depicts the device 10 after a relatively thin liner layer of semiconductor material 22 was formed in the trench 12 by performing any of a variety of known epitaxial deposition processes. The liner semiconductor material 22 will substantially conform to the configuration of the generally U-shaped trench 12. The thickness and material of construction of the generally U-shaped liner semiconductor material 22 may vary depending upon the particular application. In one embodiment, the liner semiconductor material 22 is formed to a thickness that is less than a critical thickness for the semiconductor material such that the liner semiconductor material 22 is fully strained and substantially defect free. For example, in one embodiment, the liner semiconductor material 22 may be comprised of a layer of silicon-germanium ($Si_{(1-x)}Ge_{(x)}$), and it may have a thickness of about 2-4 nm. In one example, the liner semiconductor material 22 may be a layer of silicon-germanium ($Si_{(1-x)}Ge_{(x)}$), where the value of x falls within the range of about 0.10-0.80 (e.g., $SiGe_{(0.1)}$-$SiGe_{(0.8)}$). In one illustrative embodiment, the liner semiconductor material 22 may be made of materials that are specifically tailored for N-type or P-type devices, e.g., SiGe for PMOS devices and SiC for NMOS devices, by masking appropriate areas when forming the liner semiconductor material 22. If desired, various materials, such as carbon, may be incorporated into the liner semiconductor material 22 as it is being formed. In one illustrative embodiment, the semiconductor material 22 may be one of a III-V material, InGaAs, GaAs, InAs, GaSb, InSbAs, SiGe, Ge, etc. In general, as will be explained more fully below, the liner semiconductor material 22 should be made of a material that permits the material of the substrate 14 to be selectively etched and removed relative to the liner semiconductor material 22.

The generally U-shaped liner semiconductor material 22 has a bottom 22A, a plurality of substantially vertically oriented sidewalls 22B and an upper surface 22S. The liner semiconductor material 22 defines a transistor cavity 15 wherein at least portions of the gate structure and source/drain structures for the device 10 will be positioned in the completed device 10. In one illustrative embodiment, the transistor cavity 15 may have a lateral interior width 15W (in the gate width direction—see view X-X) at the upper surface 14S of the substrate 14 of about 14 nm and a vertical depth of about 27 nm. In the depicted example, the liner semiconductor material 22 is comprised of a single layer of semiconductor material that is formed above and on and in direct physical contact with the interior surfaces of the trench 12. However, in some applications, two or more generally U-shaped liner semiconductor materials may be sequentially formed within the trench 12 wherein, in that case, the inner most liner layer within the trench 12 would serve to define the transistor cavity 15, while the first (outermost) liner layer within the trench 12 would need to be made of a material that permits the material of the substrate 14 to be selectively etched and removed relative to the outermost liner semiconductor material.

As indicated above, the gate structure for the device 10 may be formed using either "gate-first" or "replacement gate" processing techniques. The following drawings will depict the illustrative situation where the gate structure is formed using a replacement gate technique. Accordingly, FIG. 1E depicts the device 10 after an illustrative dummy or sacrificial gate structure 24 was formed in the transistor cavity 15 using well-known techniques. The gate-length (GL) and gate-width (GW) direction of the device 10 are depicted in the plan view drawing. In one illustrative embodiment, the schematically depicted sacrificial gate structure 24 includes an illustrative sacrificial gate insulation layer 24A and an illustrative sacrificial gate electrode 24B. An illustrative gate cap layer 26 (e.g., silicon nitride) may also be formed above the sacrificial gate electrode 24B. A sidewall spacer 28 (e.g., silicon nitride) has also been formed adjacent the sacrificial gate structure 24. The sacrificial gate structure 24, the gate cap layer 26 and the spacer 28 may all be formed using traditional manufacturing techniques. The sacrificial gate insulation layer 24A may be comprised of a variety of different materials, such as, for example, silicon dioxide, etc., and its thickness may vary depending upon the particular application, e.g., it may have a physical thickness of about 0.5-3 nm. Similarly, the sacrificial gate electrode 24B may also be made of a variety of conductive materials, e.g., polysilicon, amorphous silicon, etc. As depicted, a substantial portion of the sacrificial gate structure 24 is positioned within the interior of the transistor cavity 15, i.e., within the generally U-shaped liner semiconductor material 22. In operation, portions of the liner semiconductor material 22 positioned adjacent the sacrificial gate structure 24 will act as the channel region of the completed device 10. Formation of the replacement gate structure 24 results in the creation of source/drain cavities 22X within the transistor cavity 15.

FIG. 1F depicts the device 10 after an epitaxial growth process was performed to form source/drain structures 30 in the source/drain cavities 22X, i.e., on the exposed portions of the sidewalls 22B and the bottom 22A of the transistor cavity 15. The source/drain structures 30 may be comprised of a variety of different semiconductor materials. For example, the source/drain structures 30 may be comprised of silicon, SiGe, Ge, SiC, a III-V material, InGaAs, GaAs, InAs, GaSb, InSbAs, etc. Depending upon the materials selected for the source/drain structures 30 and the liner semiconductor material 22, the liner semiconductor material 22 may or may not be readily visible and distinctive from the source/drain structures 30 after the source/drain structures 30 are formed, i.e., the liner semiconductor material 22 may effectively merge into the source/drain structures 30. Appropriate N or P type dopant materials may be added to the source/drain structures 30 as they are being formed, i.e., in situ doping, or the N or P type dopant materials may be added to the source/drain structures 30 after they are formed by performing one or more ion implantation processes. The physical size of the source/drain structures 30 may vary depending upon the particular application. In the example shown in FIG. 1F, the epi growth process was stopped at a point wherein the epi material just substantially fills the source/drain cavities 22X, note the beginning of tapered edge 30A of epi material reflecting the shape the epi material will take when growing in an unconfined space due to the crystallographic orientation of the liner semiconductor material 22. In the illustrative embodiment shown in FIG. 1F, the source/drain structures 30 may have a lateral width 30W (in the gate width direction—see view Y-Y) over the entire vertical height of the source/drain structures 30 that is less than the lateral width 12W (see FIG. 1C) of the trench 12 at the upper surface 14S of the substrate 14. FIG. 1O depicts an example wherein the epi process is performed to form larger (taller) and wider epi source/drain structures 30X. In the case where a transistor device 10 spans multiple of the generally U-shaped semiconductor material regions 22 (formed in spaced-apart trenches), the source drain regions (30, 30X) may remain unmerged or they may be merged together by continuing to grow epi material.

FIG. 1G depicts the device 10 after a layer of insulating material 32 was formed on the device 10. The layer of insulating material 32 may be comprised of a variety of different materials, such as, for example, silicon dioxide.

FIG. 1H depicts the device 10 after one or more chemical mechanical polishing (CMP) processes were performed to planarize the upper surface of the layer of insulating material 32 using the upper surface of the sacrificial gate electrode 24B as a polish-stop layer. This polishing process removes the gate cap layer 26 and exposes the sacrificial gate electrode 24B for removal.

FIG. 1I depicts the device 10 after one or more etching processes were performed to remove the sacrificial gate structure 24, i.e., the sacrificial gate electrode 24B and the sacrificial gate insulation layer 24A, and thereby define a replacement gate cavity 36.

The next major process operation involves the formation of the materials for the final gate structure 37 for the device 10. Accordingly, FIG. 1J depicts the device 10 after an illustrative gate insulation layer 38 and the material (or multiple materials) for an illustrative gate electrode 40 were deposited into the gate cavity 36 and after a CMP process was performed to remove excess materials positioned outside of the gate cavity 36 above the insulating material 32.

The gate insulation layer 38 may be comprised of a variety of different materials, such as, for example, silicon dioxide, a so-called high-k (k value greater than 10) insulation material (where k is the relative dielectric constant), etc. The thickness of the gate insulation layer 38 may also vary depending upon the particular application, e.g., it may have a physical thickness of about 0.5-3 nm. Similarly, the gate electrode 40 may also be of a variety of conductive materials, such as highly doped polysilicon or amorphous silicon, or it may be comprised of one metal layer or a stack of metal layers that act as the gate electrode. The gate electrode may also be comprised of one metal layer to match the required work function of the device and a metal layer cap to prevent oxidation and provide good contact adhesion and low contact resistance. As will be recognized by those skilled in the art after a complete reading of the present application, the final gate structure 37, i.e., the gate insulation layer and the gate electrode, is intended to be representative in nature. That is, the final gate structure 37 may be comprised of a variety of different materials and it may have a variety of configurations.

FIG. 1K depicts the device 10 after one or more recess etching processes were performed to recess the materials of the final gate structure 37 within the gate cavity 36 so as to make room for a gate cap layer 42. Thereafter, a layer of gate cap material, e.g., silicon nitride, was deposited so as to overfill the cavity 36 above the recessed gate materials and a CMP process operation was performed to remove excess amounts of the gate cap material positioned outside of the gate cavity 36 so as to thereby define the gate cap layer 42. As depicted, the final gate structure 37 is positioned adjacent the sidewalls 22B and the bottom surface 22A of the generally U-shaped liner semiconductor material 22. As noted above, in operation, portions of the liner semiconductor material 22 that surrounds three sides of the final gate structure 37 will act as the channel region of the device 10 while other portions of the liner semiconductor material 22 extend into the source/drain regions of the device 10 and contact or become part of the source/drain structures 30. In the example depicted in FIG. 1K (view X-X), the gate materials were recessed such that the upper surface 37S of the final gate structure 37 is approximately level with the upper surface 22S of the transistor cavity 15. However, in some cases, the upper surface 37S of the of the final gate structure 37 may be lower or higher than that depicted in FIG. 1K. Ideally, the upper surface 37S of the final gate structure 37 will be located level with or slightly above the upper surface 22S of the transistor cavity 15 such that the full vertical height of the liner semiconductor sidewalls 22B may be used as part of the channel region of the device, i.e., so that the entire volume of the liner semiconductor material 22 in the channel region of the device may be utilized. Such a gate-liner configuration will maximize the drive current that the device 10 may generate. However, in other cases, the recessing of the gate materials may result in the upper surface 37S of the final gate structure 37 being positioned slightly below the upper surface 22S of the transistor cavity 15, but nevertheless result in a fully functional device.

FIG. 1L depicts the device 10 after a brief recess etching process was performed to remove the portions of the spacer 28 positioned above the surface 14S of the substrate 14 (see view X-X). In the case where the spacer 28 and the gate cap layer 42 are made of the same material (e.g., silicon nitride), this process operation will also result in some thinning of the gate cap layer 42 as depicted in the drawing.

FIG. 1M depicts the device 10 after an etching process, such as a wet etching process or a combination of a dry etching process and a wet etching process, was performed to remove the material of the substrate 14 relative to the generally U-shaped liner semiconductor material 22 in the general area of the channel region of the device 10 and thereby define a cavity 50 that surrounds (on three sides) the liner semiconductor material 22 in the channel region of the device 10. In one embodiment, the cavity 50 is formed such that a portion 52 of the cavity extends under the liner semiconductor material 22, i.e., under the transistor cavity 15, in the gate width direction of the device. In one embodiment, the etching process is performed such that a residual portion 14B of the substrate material 14 remains positioned between the bottom of the semiconductor material 22 and the isolation implant region 18. In one particularly illustrative embodiment, there may be little to none of the residual substrate material 14B at a location above the implant region 18 (i.e., a portion of the cavity 52 may extend into or contact the implant region 18) so as to provide good isolation between the source and drain regions. As depicted in view Z-Z (gate length cross-section) the cavity 50 may be formed such that the portion 52 of the cavity 50 extends laterally under the entire channel of the device 10 and partially under the source/drain structures 30.

FIG. 1N depicts the device 10 after several process operations were performed to essentially fill the cavity 50 with insulating material 54. In one embodiment, the layer of insulating material 54 may be deposited so as to overfill the cavity 50. Thereafter, a CMP process may be performed to remove excess portions of the layer of insulating material 54 using the layer of insulating material 38 as a polish-stop layer. The layer of insulating material 54 may be comprised of a variety of different materials, such as, for example, silicon dioxide, silicon oxynitride or any other dielectric material in common use in the semiconductor manufacturing industry, and it may be formed by performing a variety of techniques, e.g., CVD, ALD, etc. The layer of insulating material 54 may be comprised of the same material as that of the layer of insulating material 20, or it may be comprised of a different material. In the depicted example, the final gate structure 37 is positioned entirely within the generally U-shaped liner semiconductor material 22 (see view X-X) and the channel region portion of the liner semiconductor material 22 are surrounded on three sides by the insulating material 54. At the point of fabrication depicted in FIG. 1N, traditional manufacturing techniques may be performed to complete the manufacture of the device 10. For example, contacts and metallization layers may be formed above the device 10 using traditional techniques.

As indicated above, the devices disclosed herein may be formed in trenches having a variety of configurations. FIGS. 1P and 1Q are examples of devices 10 formed in trenches having the configuration of the trenches 12A and 12B, respectively, shown in FIG. 1A.

As indicated above, the gate structure for the device 10 may be formed using gate first techniques as well as replacement gate techniques. In the case of a gate first technique, the sacrificial gate structure 24 shown in FIG. 1E would instead be a final gate structure. FIG. 1R depicts a final gate structure 25 for the device formed using a gate first technique. As shown therein, the gate structure 25 is comprised of a gate insulation layer 27, e.g., silicon dioxide, and a gate electrode 29 comprised of polysilicon. FIG. 1S depicts a gate structure 25 that is comprised of a high-k gate insulation layer 27A, e.g., silicon dioxide, a work function adjusting metal layer 31 and one or more conductive materials (e.g., polysilicon and/or other metals) that define a gate electrode 33. In a gate first technique, the gate materials may be sequentially deposited (along with a gate cap material) above the substrate 14 after the trenches 12 are formed and subsequently patterned to define the overall gate structure.

FIG. 1T depicts an embodiment wherein the gate structures described herein may be positioned such that portions of the overall gate structure 47 of the device are positioned partially with multiple, e.g., three, of the U-shaped liner semiconductor materials 22 formed in three spaced-apart trenches 12 defined in the substrate 14 so as to effectively increase the gate width of such a transistor device. The gate structure 47 shown in FIG. 1T is simplistically depicted in that the various individual layers of material, like the gate insulation layer, are not separately depicted. Also shown in FIG. 1T is a gate cap layer 49.

Figure 2A:
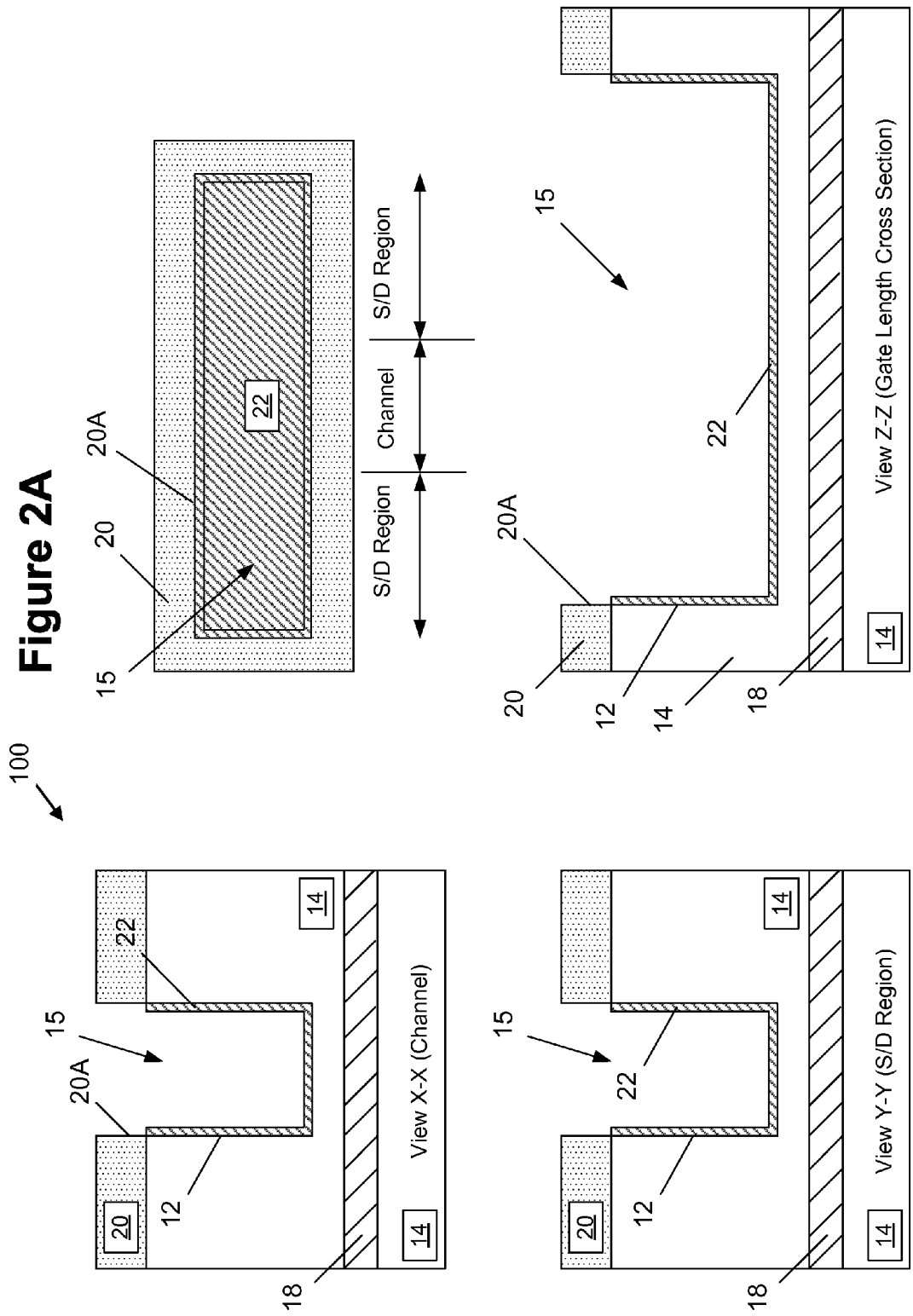

FIGS. 2A-2E depict yet other illustrative methods disclosed herein of forming source/drain regions that are positioned at least partially inside a generally U-shaped semiconductor material by using a plurality of placeholder source/drain structures. FIG. 2A depicts a device 100 at a point in fabrication that corresponds to that shown in FIG. 1D, i.e., after the U-shaped liner semiconductor material 22 was grown in the trench 12 so as to define the transistor cavity 15.

Figure 2B:
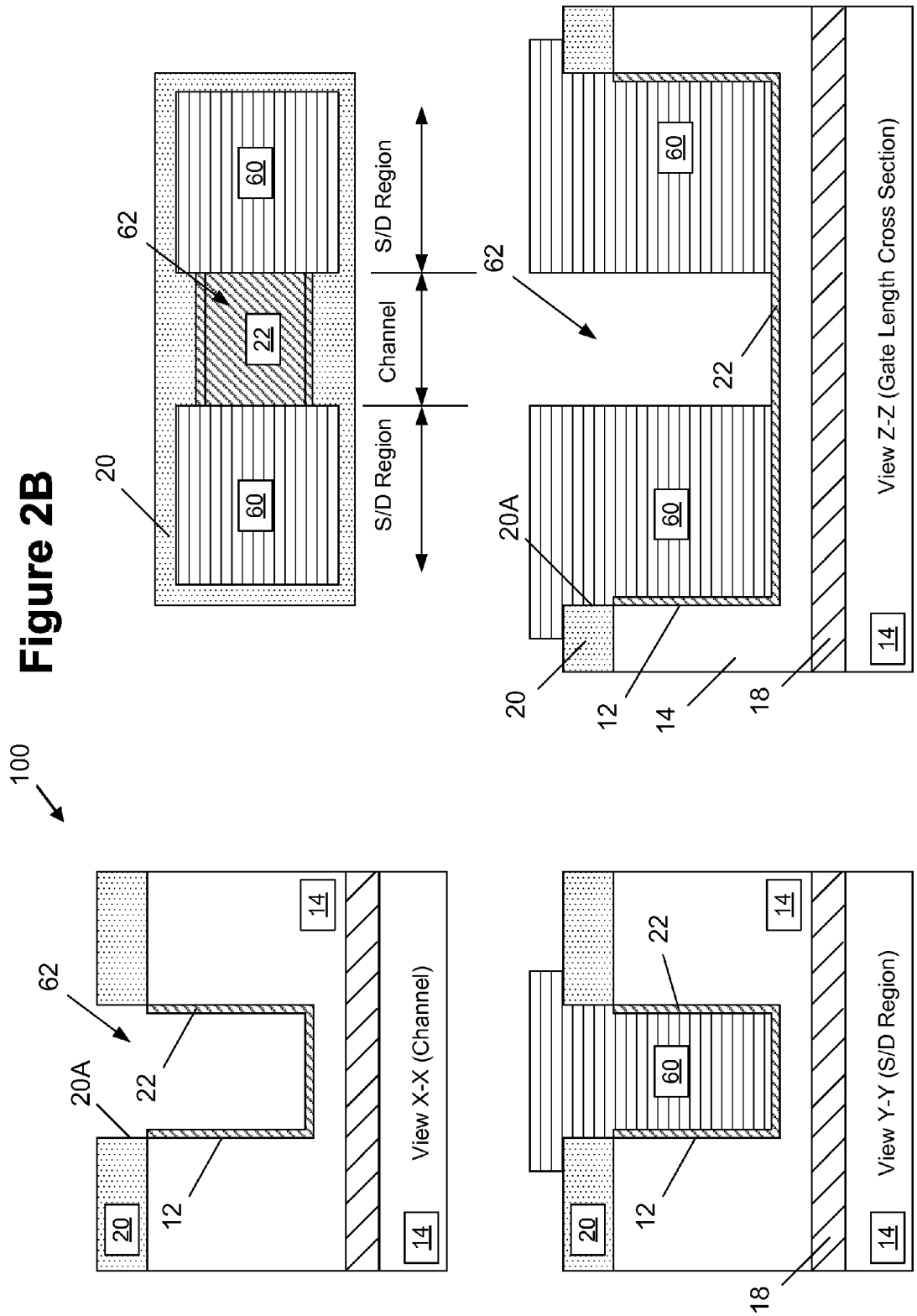

FIG. 2B depicts the device 100 after a source/drain placeholder material 60 was deposited into the transistor cavity 15 and patterned so as to define a gate cavity 62 between the spaced-apart source/drain placeholder structures. Portions of the bottom 22A and sidewalls 22B of the liner semiconductor material 22 are exposed within the gate cavity 62. The placeholder material 60 may be made of a variety of materials, e.g., silicon nitride, and its overall thickness may vary depending upon the particular application.

FIG. 2C depicts the device 100 after the above-described final gate structure 37 and gate cap layer 42 were formed in the gate cavity 62.

FIG. 2D depicts the device 100 after an etching process was performed through a patterned etch mask (not shown), such as a patterned photoresist mask, to remove the majority of the placeholder material 60 and thereby define a plurality of source/drain cavities 66. Portions of the placeholder material 60 are left in place adjacent the gate structure 37 so as to serve the function of sidewall spacers 60X to protect and, along with the gate cap layer 42, encapsulate the gate materials.

Figure 2E:
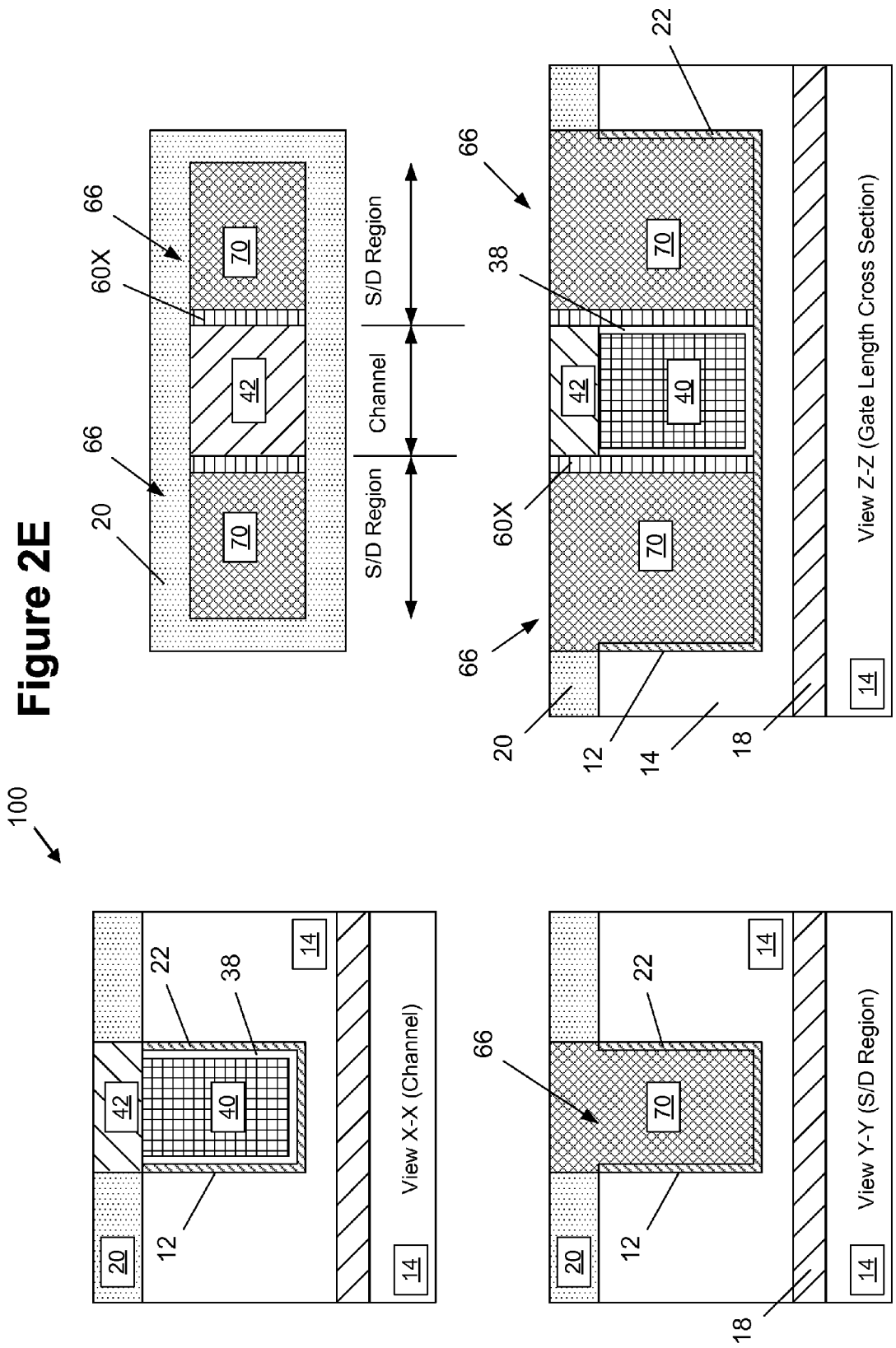

FIG. 2E depicts the device 100 after one or more conductive materials, such as a metal or a metal alloy, such as tungsten, cobalt-nickel, nickel, nickel-platinum, etc., was formed in the source/drain cavities 66 so as to define the final source/drain structures 70 for the device 100. The source/drain structures 70 may be formed by depositing the appropriate layers of material (if present), e.g., barrier layer, adhesion layer, fill layer, etc., across the substrate 14 so as to overfill the source/drain cavities 66 and thereafter performing one or more CMP processes to remove excess materials positioned outside of the source/drain cavities 66 using the gate cap layer 42 and the layer of insulating material 20 as polish-stop materials. To the extent that barrier layers, adhesion layers and the like are formed, they should be considered to be part of the source/drain contact structures 70. At the point of fabrication depicted in FIG. 2E, traditional manufacturing techniques may be performed to complete the manufacture of the device 100. For example, contacts and metallization layers may be formed above the device 100 using traditional techniques.

As will be appreciated by those skilled in the art after a complete reading of the present application, the unique architecture and structure of the devices disclosed herein provide many unique benefits. For example, since the liner semiconductor material 22 may be formed to a thickness that is less than a critical thickness for the semiconductor material 22, the U-shaped liner semiconductor material 22 may be fully strained and substantially defect free. The devices also have a large effective channel volume due to the two substantially vertically oriented legs 22B and the bottom portion 22A of the liner semiconductor material 22, thereby enabling the devices to generate large on-state currents. Additionally, since, in some embodiments (i.e., a transistor formed in a single trench 12), the maximum lateral width (in the channel width direction of the device) of the overall finished device is substantially defined by the lateral width 12W of the trench 12, the devices disclosed herein may be more densely packed than, for example, FinFET devices. As an example, a typical fin pitch used when forming multiple fins for FinFET devices in a substrate may be about 40 nm to insure that when epi material is grown on the fins in the source/drain regions of the devices there is sufficient space between the fins so that no undesirable contact between the epi semiconductor material occurs on adjacent devices. In contrast, since the lateral width 12W of the trenches 12 substantially define the maximum overall lateral width of the overall device (except in cases where additional epi material is grown as shown in FIG. 1O), the trenches 12 may be formed very close to one another. For example, with reference to FIG. 1T, the lateral space 12Z between the trenches 12 (in the gate width direction of the devices) may be on the order of about 10 nm or even smaller, thereby leading to greater packing densities. With respect to the device 100, the formation of the source/drain regions comprised of a metal or metal alloy provides the physical possibility of creating low resistive source/drain contacts for MOSFET devices to thereby improve their operational characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a transistor device, the method comprising:
   forming a trench in a semiconductor substrate, said trench having an exposed interior surface;
   after forming said trench having said exposed interior surface, forming a liner semiconductor material above the entire exposed interior surface of said trench, said liner semiconductor material defining a transistor cavity;
   forming a plurality of spaced-apart source/drain placeholder structures that are at least partially positioned within said transistor cavity, said spaced-apart source/ drain placeholder structures defining a gate cavity therebetween where a portion of said liner semiconductor material is exposed within said gate cavity;

forming a gate structure that is at least partially positioned within said gate cavity;

after forming said gate structure, removing at least a portion of said source/drain placeholder structures to define a plurality of source/drain cavities within said transistor cavity on opposite sides of said gate structure; and forming a source/drain structure in each of said source/ drain cavities, wherein at least a portion of each of said source/drain structures is positioned within said transistor cavity.

2. The method of claim 1, wherein said gate structure is a final gate structure.

3. The method of claim 1, wherein said liner semiconductor material is comprised of one of SiGe, Ge, a III-V material, InGaAs, GaAs, InAs, GaSb, or InSbAs.

4. The method of claim 1, wherein said gate structure is comprised of a silicon dioxide gate insulation layer and a polysilicon gate electrode.

5. The method of claim 1, wherein said gate structure is comprised of a high-k gate insulation layer and a gate electrode comprised of at least one layer of metal.

6. The method of claim 1, wherein said substrate is a silicon substrate.

7. The method of claim 1, wherein forming said gate structure comprises forming said gate structure such that an upper surface of said gate structure is positioned above or level with an upper surface of said transistor cavity.

8. The method of claim 1, wherein said transistor device has a gate width direction and wherein, in a cross-section taken through said gate structure in said gate width direction, the entire gate structure is positioned within said transistor cavity defined by said liner semiconductor material.

9. The method of claim 1 wherein said transistor device has a gate width direction and wherein, in a cross-section taken through one of said source/drain structures in said gate width direction, said trench has a lateral width at an upper surface of said substrate, and a lateral width of said source/ drain structure in said gate width direction at any location along a vertical height of said source/drain structure is less than said lateral width of said trench.

10. The method of claim 1, wherein said transistor device has a gate width direction and wherein, in a cross-section taken through said liner semiconductor material in said gate width direction, said liner semiconductor material has a generally U-shaped cross-sectional configuration.

11. The method of claim 1, wherein said liner semiconductor material has a thickness that falls within a range of 2-4nm.

12. The method of claim 1, wherein said liner semiconductor material is comprised of multiple layers of semiconductor material.

13. The method of claim 1, wherein forming said liner semiconductor material above said entire interior surface of said trench comprises forming said liner semiconductor material on and in physical contact with said entire interior surface of said trench.

14. The method of claim 1, wherein forming said source/ drain structure in each of said source/drain cavities comprises forming said source/drain structures comprised of a metal or a metal alloy in each of said source/drain cavities.

15. The method of claim 1, wherein forming said plurality of spaced-apart source/drain placeholder structures comprises depositing a layer of material for said source/drain placeholder structures such that it overfills said transistor cavity and performing at least one etching process to define said spaced-apart source/drain placeholder structures.

16. The method of claim 1, wherein, in a cross-section taken through said gate structure in a gate width direction, said entire liner semiconductor material is positioned within said trench.

17. The method of claim 1, wherein forming said liner semiconductor material above said entire exposed interior surface of said trench comprises depositing said liner semiconductor material above said entire exposed interior surface.

18. A method of forming a transistor device, said transistor device having a channel region and a gate width direction, the method comprising:

forming a trench in a semiconductor substrate, said trench having an exposed interior surface;

after forming said trench having said exposed interior surface, forming a liner semiconductor material above the entire exposed interior surface of said trench, wherein, in a cross-section taken through said liner semiconductor material in said gate width direction in said channel region, said liner semiconductor material has a generally U-shaped cross-sectional configuration and wherein said liner semiconductor material defines a transistor cavity;

forming a plurality of spaced-apart source/drain placeholder structures that are at least partially positioned within said transistor cavity, said spaced-apart source/ drain placeholder structures defining a gate cavity therebetween where a portion of said liner semiconductor material is exposed within said gate cavity;

forming a gate structure that is at least partially positioned within said gate cavity;

after forming said gate structure, removing at least a portion of said source/drain placeholder structures to define a plurality of source/drain cavities within said transistor cavity on opposite sides of said gate structure; and forming a source/drain structure comprised of a metal or metal alloy in each of said source drain cavities, wherein at least a portion of each of said source/drain structures is positioned within said transistor cavity.

19. The method of claim 18, wherein forming said gate structure comprises forming said gate structure such that an upper surface of said gate structure is positioned above or level with an upper surface of said transistor cavity.

20. The method of claim 18, wherein, in a cross-section taken through said gate structure in said gate width direction, the entire gate structure is positioned within said transistor cavity defined by said liner semiconductor material.

21. The method of claim 18 wherein, in a cross-section taken through one of said source/drain structures in said gate width direction, said trench has a lateral width at an upper surface of said substrate, and a lateral width of said source/ drain structure in said gate width direction at any location along a vertical height of said source/drain structure is less than said lateral width of said trench.

22. The method of claim 18, wherein said liner semiconductor material is comprised of multiple layers of semiconductor material.

23. The method of claim 18, wherein forming said liner semiconductor material above said entire interior surface of said trench comprises forming said liner semiconductor material on and in physical contact with said entire interior surface of said trench.

24. The method of claim 23, wherein, in a cross-section taken through said gate structure in said gate width direction, the entire liner semiconductor material is positioned within said trench.

25. The method of claim 18, wherein forming said liner semiconductor material above said entire exposed interior surface of said trench comprises depositing said liner semiconductor material above said entire exposed interior surface.

26. A transistor device having a gate width direction and a channel region, said transistor device comprising:
 a trench defined in a semiconductor substrate;
 a liner semiconductor material positioned within said trench, said liner semiconductor material defining a transistor cavity and comprising multiple layers of semiconductor material;
 a gate structure that is at least partially positioned within said transistor cavity; and
 a source region structure and a drain region structure positioned on opposite sides of said gate structure, wherein said source region structure and said drain region structure are comprised of a metal or a metal alloy and wherein at least a portion of each of said source region structure and said drain region structure is positioned within said transistor cavity.

27. The device of claim 26, wherein said liner semiconductor material is comprised of one of SiGe, Ge, a III-V material, InGaAs, GaAs, InAs, GaSb, or InSbAs.

28. The device of claim 26, wherein said gate structure is comprised of a silicon dioxide gate insulation layer and a polysilicon gate electrode.

29. The device of claim 26, wherein said gate structure is comprised of a high-k gate insulation layer and a gate electrode comprised of at least one layer of metal.

30. The device of claim 26, wherein an upper surface of said gate structure is positioned below a level of an upper surface of said transistor cavity.

31. The device of claim 26, wherein, in a cross-section taken through said gate structure in said gate width direction, the entire gate structure is positioned within said transistor cavity defined by said liner semiconductor material.

32. The device of claim 26, wherein, in a cross-section taken through said source region structure in said gate width direction, said trench has a lateral width at an upper surface of said substrate, and a lateral width of said source region structure in said gate width direction at any location along a vertical height of said source region structure is less than said lateral width of said trench.

33. The device of claim 26, wherein, in a cross-section taken through said gate structure in said gate width direction, the entire liner semiconductor material is positioned within said trench.

34. The device of claim 26, wherein, in a cross-section taken through said liner semiconductor material in said gate width direction in said channel region, said liner semiconductor material has a generally U-shaped cross-sectional configuration.

35. The device of claim 26, wherein said liner semiconductor material has a thickness that falls within a range of 2-4nm.

36. The device of claim 26, wherein said trench has an interior surface and wherein said liner semiconductor material is positioned on and in physical contact with the entire interior surface of said trench.

* * * * *